US010748901B2

(12) United States Patent
Rubin et al.

(10) Patent No.: US 10,748,901 B2
(45) Date of Patent: Aug. 18, 2020

(54) INTERLAYER VIA CONTACTS FOR MONOLITHIC THREE-DIMENSIONAL SEMICONDUCTOR INTEGRATED CIRCUIT DEVICES

(71) Applicant: International Business Machines Corporation, Armonk, NY (US)

(72) Inventors: Joshua M. Rubin, Albany, NY (US); Nicolas Loubet, Guilderland, NY (US); Terence B. Hook, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 81 days.

(21) Appl. No.: 16/166,996

(22) Filed: Oct. 22, 2018

(65) Prior Publication Data

US 2020/0126987 A1    Apr. 23, 2020

(51) Int. Cl.
| | | |
|---|---|---|
| *H01L 27/092* | (2006.01) | |
| *H01L 29/08* | (2006.01) | |
| *H01L 29/66* | (2006.01) | |
| *H01L 29/06* | (2006.01) | |
| *H01L 29/78* | (2006.01) | |
| *H01L 29/49* | (2006.01) | |

(Continued)

(52) U.S. Cl.
CPC .... *H01L 27/0924* (2013.01); *H01L 21/76832* (2013.01); *H01L 21/8221* (2013.01);
(Continued)

(58) Field of Classification Search
CPC ......... H01L 21/823871; H01L 21/8221; H01L 23/5226
See application file for complete search history.

(56) References Cited

U.S. PATENT DOCUMENTS 5,100,817 A * 3/1992 Cederbaum ......... H01L 21/8221
257/E21.614
7,558,141 B2 * 7/2009 Katsumata ............... G11C 7/18
365/185.02

(Continued)

FOREIGN PATENT DOCUMENTS

WO    2014209278 A1    12/2014

OTHER PUBLICATIONS

List of IBM Patents or Patent Applications Treated as Related.

*Primary Examiner* — Victoria K. Hall
(74) *Attorney, Agent, or Firm* — Vazken Alexanian; Ryan, Mason & Lewis, LLP

(57) ABSTRACT

Devices and methods are provided for fabricating metallic interlayer via contacts within source/drain regions of field-effect transistor devices of a monolithic three-dimensional semiconductor integrated circuit device. For example, a semiconductor integrated circuit device includes a first device layer and a second device layer disposed on the first device layer. The first device layer includes a metallic interconnect structure formed in an insulating layer. The second device layer includes first and second field-effect transistor devices having respective first and second gate structures. A metallic interlayer via contact is disposed between the first and second gate structures in contact with the metallic interconnect structure of the first device layer, wherein a width of the metallic interlayer via contact is defined by a spacing between adjacent sidewalls of the first and second gate structures. Epitaxial source/drain layers for the first and second field-effect transistor devices are embedded within the metallic interlayer via contact.

15 Claims, 19 Drawing Sheets

(51) Int. Cl.
   *H01L 21/768*     (2006.01)
   *H01L 23/522*     (2006.01)
   *H01L 21/8238*    (2006.01)
   *H01L 21/822*     (2006.01)

(52) U.S. Cl.
   CPC ........ *H01L 21/823821* (2013.01); *H01L 21/823864* (2013.01); *H01L 21/823871* (2013.01); *H01L 23/5226* (2013.01); *H01L 29/0673* (2013.01); *H01L 29/0847* (2013.01); *H01L 29/49* (2013.01); *H01L 29/6656* (2013.01); *H01L 29/66545* (2013.01); *H01L 29/66795* (2013.01); *H01L 29/7851* (2013.01)

(56) References Cited

U.S. PATENT DOCUMENTS

| | | | |
|---|---|---|---|
| 7,723,207 B2 | 5/2010 | Alam et al. | |
| 8,642,416 B2 | 2/2014 | Or-Bach et al. | |
| 8,791,723 B2 | 7/2014 | Mallikarjunaswamy | |
| 8,928,149 B2 | 1/2015 | Chen | |
| 9,711,501 B1* | 7/2017 | Basker | H01L 27/0688 |
| 10,593,681 B1* | 3/2020 | Rubin | H01L 21/8221 |
| 2008/0023770 A1* | 1/2008 | Kim | H01L 21/28556 257/365 |
| 2008/0217782 A1* | 9/2008 | Frank | H01L 21/76898 257/755 |
| 2009/0079000 A1* | 3/2009 | Yamazaki | H01L 27/1229 257/351 |
| 2009/0134491 A1* | 5/2009 | Plum | H01L 27/10817 257/532 |
| 2009/0185407 A1* | 7/2009 | Park | G11O 5/025 365/51 |
| 2011/0298021 A1* | 12/2011 | Tada | H01L 27/108 257/288 |
| 2014/0061810 A1* | 3/2014 | Sunamura | H01L 27/1225 257/368 |
| 2019/0006222 A1* | 1/2019 | Or-Bach | H01L 27/11 |
| 2019/0081145 A1* | 3/2019 | Xie | H01L 21/823828 |

* cited by examiner

INTERLAYER VIA CONTACTS FOR MONOLITHIC THREE-DIMENSIONAL SEMICONDUCTOR INTEGRATED CIRCUIT DEVICES

TECHNICAL FIELD

This disclosure generally relates to semiconductor fabrication techniques and, in particular, to methods for fabricating interlayer via contacts for monolithic three-dimensional (3D) semiconductor integrated circuit (IC) devices.

BACKGROUND

In semiconductor device manufacturing, 3D monolithic designs may include stacked layers of devices (e.g., field effect transistor (FET) devices) that are sequentially processed to reduce a device footprint. For example, a FET-over-FET integration scheme is one form of 3D monolithic integration in which p-type and n-type FET devices are separately formed on different device layers of a 3D monolithic semiconductor IC device. The separation of p-type and n-type FET devices provides certain advantages such as the ability to use more optimal or compatible semiconductor materials (e.g., germanium, silicon-germanium, silicon, III-V compound semiconductor material, etc.) on different layers to enhance or otherwise optimize device performance. In such cases and especially for devices with p-type FETs over n-type FETs or vice versa, a significant amount of interlayer via contacts are needed to make a functional integrated circuit. In this regard, the interlayer via contacts can consume a large amount of surface area and thereby diminish the scaling benefits of the 3D monolithic approach.

SUMMARY

Embodiments of the invention include methods for fabricating interlayer via contacts within source/drain regions of FET devices of a monolithic 3D semiconductor IC device, as well as semiconductor devices in which interlayer via contacts are disposed within source/drain regions of FET devices of a monolithic 3D semiconductor IC device.

One embodiment includes a method for fabricating a semiconductor device which comprises: forming a semiconductor integrated circuit device comprising a first device layer and a second device layer disposed on the first device layer, wherein the first device layer comprises a metallic interconnect structure formed in an insulating layer, and an etch stop layer formed over the metallic interconnect structure, and wherein the second device layer comprises a first field-effect transistor device comprising a first gate structure, and a second field-effect transistor device comprising a second gate structure; forming an interlayer via contact opening between the first and second gate structures, wherein a width of the interlayer via contact opening is defined by a spacing between adjacent sidewalls of the first and second gate structures; forming epitaxial source/drain layers within the interlayer via contact opening for the first and second field-effect transistor devices; and forming a metallic interlayer via contact within the interlayer via contact opening in contact with an exposed portion of the metallic interconnect structure of the first device layer.

Another embodiment includes a method for fabricating a semiconductor device which comprises: forming a semiconductor integrated circuit device comprising a first device layer and a second device layer disposed on the first device layer; wherein the first device layer comprises a first metallic interconnect structure and a second metallic interconnect structure formed in an insulating layer, a first etch stop layer formed on a recessed surface of the first metallic interconnect structure which is recessed below an upper surface of the insulating layer, and a second etch stop layer formed on the upper surface of the insulating layer and on an upper surface of the second metallic interconnect structure; wherein the second device layer comprises a first field-effect transistor device comprising a first gate structure, and a second field-effect transistor device comprising a second gate structure, wherein the second metallic interconnect structure is aligned to a source/drain region between the first and second gate structures; performing an etch process to form an interlayer via contact opening between the first and second gate structures and source/drain contact openings within source/drain regions adjacent to the first and second gate structures in non-interlayer via contact locations, wherein the interlayer via contact opening and the source/drain contact openings are etched to a depth to expose portions of the second etch stop layer formed on the upper surface of the insulating layer of the first device layer, and wherein a width of the interlayer via contact opening is defined by a spacing between adjacent sidewalls of the first and second gate structures; forming epitaxial source/drain layers for the first and second field-effect transistor devices within the interlayer via contact opening and the source/drain contact openings; etching the exposed portions of the second etch stop layer at a bottom of the interlayer via contact opening and the source/drain contact openings, to expose the upper surface of the second metallic interconnect structure; and depositing one more layers of metallic material to form a metallic interlayer via contact within the interlayer via contact opening in contact with the exposed upper surface of the second metallic interconnect structure of the first device layer, and metallic source/drain contacts within the source/drain contact openings.

Another embodiment includes a semiconductor device which comprises a semiconductor integrated circuit device comprising a first device layer and a second device layer disposed on the first device layer. The first device layer comprises a metallic interconnect structure formed in an insulating layer. The second device layer comprises: a first field-effect transistor device comprising a first gate structure, and a second field-effect transistor device comprising a second gate structure; a metallic interlayer via contact disposed between the first and second gate structures in contact with the metallic interconnect structure of the first device layer, wherein a width of the metallic interlayer via contact is defined by a spacing between adjacent sidewalls of the first and second gate structures; and epitaxial source/drain layers for the first and second field-effect transistor devices embedded within the metallic interlayer via contact.

Other embodiments will be described in the following detailed description of embodiments, which is to be read in conjunction with the accompanying figures.

BRIEF DESCRIPTION OF THE DRAWINGS

FIGS. 1A-6 schematically illustrate a method for fabricating interlayer via contacts for a monolithic 3D semiconductor IC device according to an embodiment of the invention, wherein:

FIG. 1A is a schematic cross-sectional side view of a monolithic 3D semiconductor IC device structure at an intermediate stage of fabrication comprising a first (lower) device layer and a second (upper) device layer which are bonded together;

FIG. 3 is a schematic cross-sectional side view of the semiconductor device structure of FIG. 2A after forming a photoresist mask which fills the interlayer via contact opening with photoresist material and which comprises openings to expose source/drain regions adjacent to the gate structures of the FET devices in non-interlayer via contact locations, and after etching source/drain contact openings in the exposed source/drain regions;

FIG. 4 is a schematic cross-sectional side view of the semiconductor device structure of FIG. 3 after removing the photoresist mask and after forming inner spacers and epitaxial source/drain layers on nanosheet stack structures of the FET devices of the upper device layer;

FIG. 5 is a schematic cross-sectional side view of the semiconductor device structure of FIG. 4 after removing a portion of the etch stop layer exposed at a bottom of the interlayer via contact opening to expose a metallic interconnect structure of the lower device layer; and FIG. 6 is a schematic cross-sectional side view of the semiconductor device structure of FIG. 5 after forming thin silicide layers on the surfaces of the epitaxial source/drain layers, forming an interlayer via contact in the interlayer via contact opening in contact with the exposed metallic interconnect structure, and after forming source/drain contacts in the source/drain contact openings.

FIGS. 7-10 schematically illustrate a method for fabricating interlayer via contacts for a monolithic 3D semiconductor IC device according to another embodiment of the invention, wherein:

FIG. 7 is a schematic cross-sectional side view of a monolithic 3D semiconductor IC device structure at an intermediate stage of fabrication comprising a first (lower) device layer and a second (upper) device layer which are bonded together;

FIG. 8 is a schematic cross-sectional side view of the semiconductor device structure of FIG. 7 after etching an interlayer via contact opening within a source/drain region between adjacent gate structures of FET devices on the upper device layer down to an etch stop layer formed on a metallic interconnect structure of the lower device layer, after etching source/drain contact openings adjacent to the gate structures of the FET devices in non-interlayer via contact locations, and after forming inner spacers and epitaxial source/drain layers on sidewalls of nanosheet stack structures of the FET device exposed within the interlayer via contact opening and the source/drain contact openings;

FIG. 9 is a schematic cross-sectional side view of the semiconductor device structure of FIG. 8 after removing the etch stop layer exposed at the bottom of the interlayer via contact opening to expose the metallic interconnect structure of the lower device layer; and FIG. 10 is a schematic cross-sectional side view of the semiconductor device structure of FIG. 9 after forming thin silicide layer on the surfaces of the epitaxial source/drain layers, forming an interlayer via contact in the interlayer via contact opening in contact with the exposed metallic interconnect structure, and after forming source/drain contacts in the source/drain contact openings of the upper device layer.

FIGS. 11-14 schematically illustrate a method for fabricating interlayer via contacts for a monolithic 3D semiconductor IC device according to yet another embodiment of the invention, wherein:

FIG. 11 is a schematic cross-sectional side view of the semiconductor device structure of FIG. 7 after concurrently etching an interlayer via contact opening and source/drain contact openings within source/drain regions adjacent to gate structures of FET devices on the upper device layer, down to etch stop layers formed on recessed surfaces of metallic interconnect structures of the lower device layer;

FIG. 12 is a schematic cross-sectional side view of the semiconductor device structure of FIG. 11 after forming inner spacers and epitaxial source/drain layers on sidewalls of nanosheet stack structures of the FET devices exposed within the interlayer via contact opening and the source/drain contact openings;

FIG. 13 is a schematic cross-sectional side view of the semiconductor device structure of FIG. 12 after removing an etch stop layer exposed at the bottom of the interlayer via contact opening to expose a metallic interconnect structure of the lower device layer; and FIG. 14 is a schematic cross-sectional side view of the semiconductor device structure of FIG. 13 after forming thin silicide layers on the surfaces of the epitaxial source/drain layers, and after forming an interlayer via contact in the interlayer via contact opening in contact with the exposed metallic interconnect structure and forming source/drain contacts in the source/drain contact openings.

FIGS. 15-18 schematically illustrate a method for fabricating interlayer via contacts for a monolithic 3D semiconductor IC device, according to another embodiment of the invention, wherein:

FIG. 15 is a schematic cross-sectional side view of a monolithic 3D semiconductor IC device structure at an intermediate stage of fabrication comprising a first (lower) device layer and a second (upper) device layer which are bonded together;

FIG. 16 is a schematic cross-sectional side view of the semiconductor device structure of FIG. 15 after concurrently etching an interlayer via contact opening and source/drain contact openings within source/drain regions adjacent to gate structures of FET devices on the upper device layer, down to an etch stop layer of the lower device layer;

FIG. 17 is a schematic cross-sectional side view of the semiconductor device structure of FIG. 16 after forming inner spacers and epitaxial source/drain layers on sidewalls of nanosheet stack structures of the FET devices exposed within the interlayer via contact opening and the source/drain contact openings; and FIG. 18 is a schematic cross-sectional side view of the semiconductor device structure of FIG. 17 after etching away portions of the etch stop layer exposed at the bottom of the source/drain contact openings and the interlayer via contact opening to expose a metallic interconnect structure of the lower device layer at the bottom of the interlayer via contact opening.

DETAILED DESCRIPTION

Figure 1A:
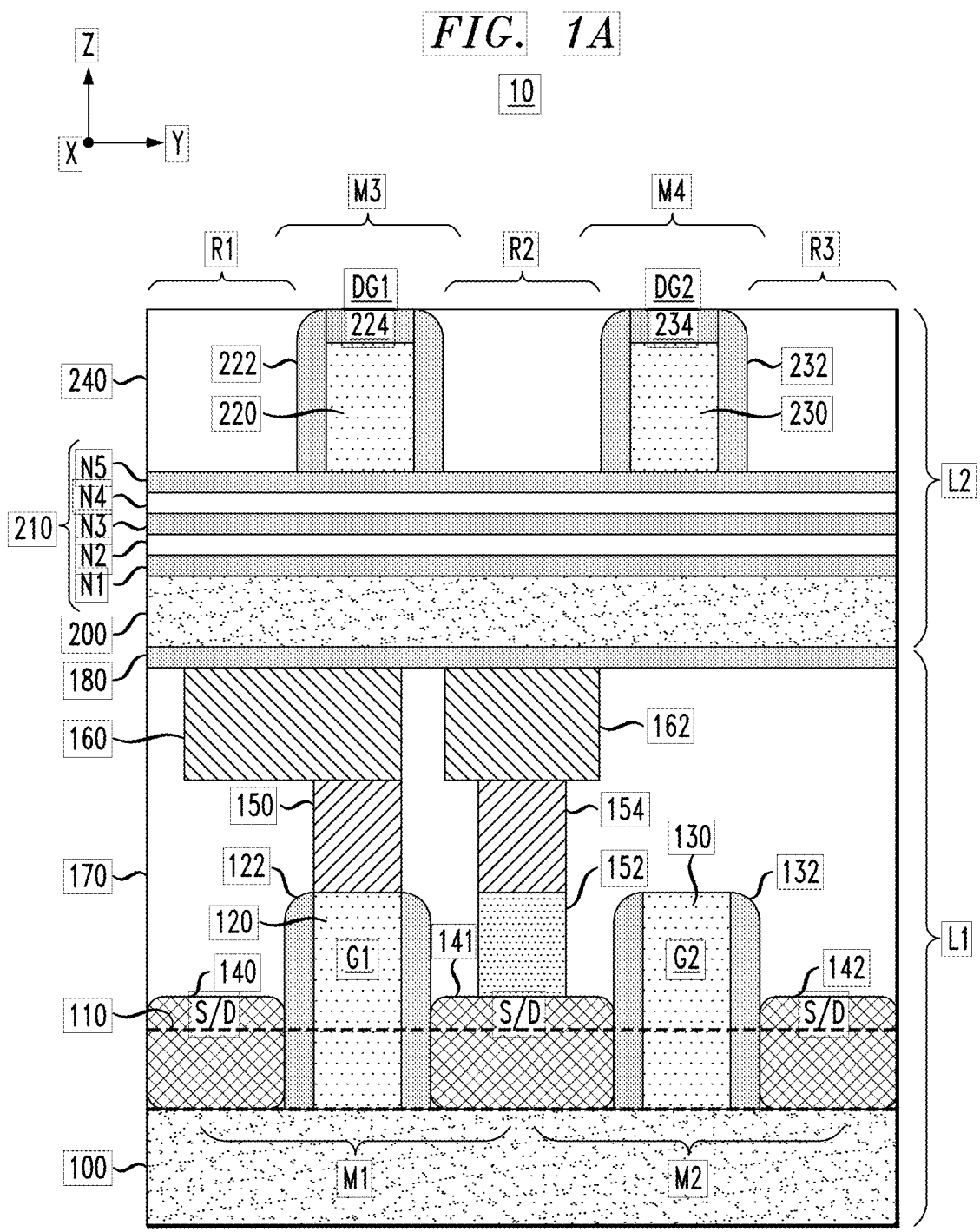

Embodiments will now be described in further detail with regard to methods for fabricating interlayer via contacts within source/drain regions of FET devices of a monolithic 3D semiconductor IC device. As discussed in further detail below, interlayer via contacts are formed by etching via contact openings in source/drain regions between adjacent FET devices, followed by formation of epitaxial source/drain layers for the FET devices within the interlayer via contact openings, followed by deposition of metallic material within the interlayer via contact openings to complete formation of the interlayer via contacts.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. To provide spatial context, XYZ Cartesian coordinates are shown in the drawings of semiconductor device structures. It is to be understood that the term "vertical" as used herein denotes a Z-direction of the Cartesian coordinates shown in the drawings, and that the terms "horizontal" or "lateral" as used herein denote an X-direction and/or a Y-direction of the Cartesian coordinates shown in the drawings, which is perpendicular to the Z-direction.

FIG. 1A through FIG. 6 schematically illustrate a method for fabricating interlayer via contacts for a monolithic 3D semiconductor IC device, according to an embodiment of the invention. To begin, FIGS. 1A and 1B are schematic views of a semiconductor device 10 at an intermediate stage of fabrication comprising a first device layer L1 (or lower layer) and a second device layer L2 (or upper layer) which are bonded together. FIG. 1A is a schematic cross-sectional side view (Y-Z plane) of the semiconductor device 10 and FIG. 1B is a top plan view (X-Y plane) of the semiconductor device, wherein FIG. 1A is a cross sectional view of the semiconductor device 10 along line 1A-1A shown in FIG. 1B. As illustrated in FIG. 1A, the lower device layer L1 comprises a semiconductor substrate 100, a vertical semiconductor fin 110, a first gate structure G1 comprising a metallic gate 120 and a gate sidewall spacer 122, a second gate structure G2 comprising a metallic gate 130 and a gate sidewall spacer 132, a plurality of source/drain layers 140, 141, and 142, a gate contact 150, source/drain contacts 152 and 154, metallic interconnects 160 and 162, an insulating layer 170, and an etch stop layer 180 (or capping layer 180). The second device layer L2 comprises a bonding layer 200, a nanosheet stack structure 210 comprising a plurality of epitaxial semiconductor layers N1, N2, N3, N4 and N5, first and second gate structures DG1 and DG2 comprising respective sacrificial (dummy) gate layers 220 and 230, gate sidewall spacers 222 and 232, and gate capping layers 224 and 234, and an insulating layer 240. In this intermediate stage of fabrication, the gate structures DG1 and DG2 are dummy gate structures wherein the sacrificial (dummy) gate layers 220 and 230 comprise, e.g., dummy gate oxide layers and dummy polysilicon gate electrode layers, as is understood by one of ordinary skill in the art.

Figure 1B:
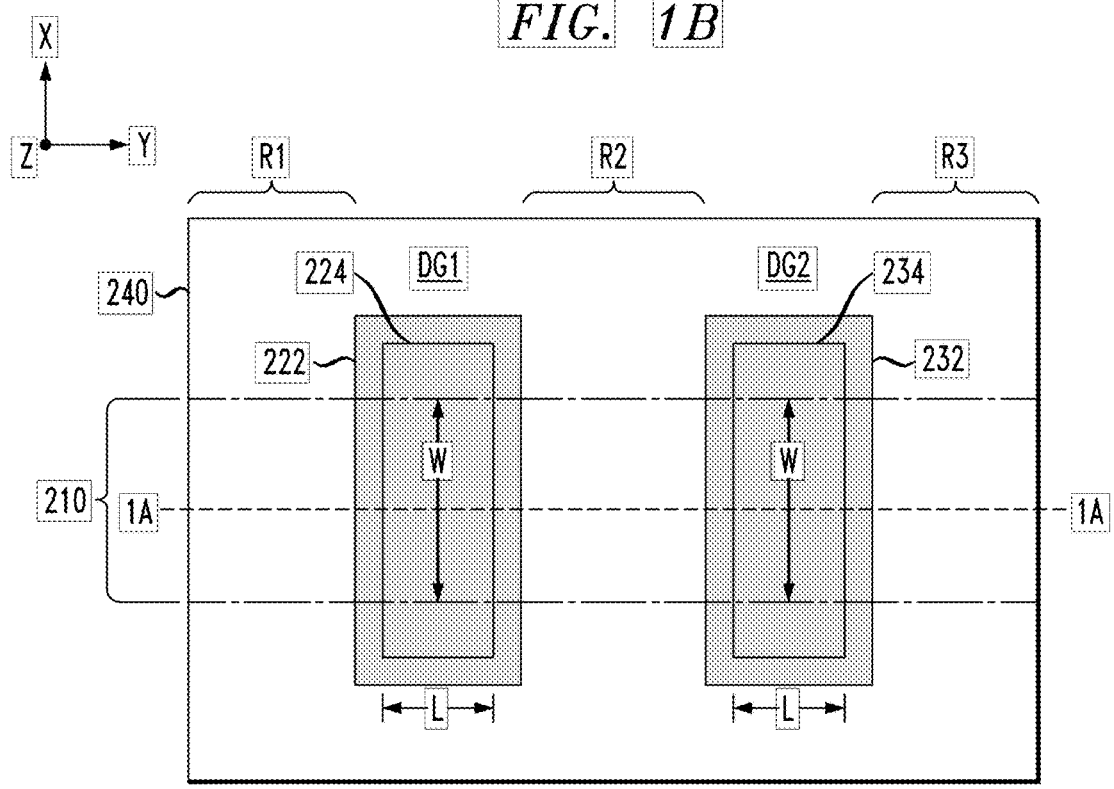
FIG. 1B is a schematic top plan view of the semiconductor device structure shown in FIG. 1A.

The intermediate semiconductor device structure 10 shown in FIGS. 1A and 1B can be fabricated using known semiconductor fabrication techniques and suitable semiconductor materials, as is readily understood by one of ordinary skill in the art. While the semiconductor substrate 100 of the first device layer L1 is illustrated as a generic substrate layer, the substrate 100 comprises various structures and layers of semiconductor and insulating material. For example, in one embodiment, the semiconductor substrate 100 comprises a bulk semiconductor substrate (e.g., wafer) formed of, e.g., silicon (Si), or other types of semiconductor substrate materials that are commonly used in bulk semiconductor fabrication processes such as germanium (Ge), a silicon-germanium (SiGe) alloy, silicon carbide (SiC), silicon-germanium carbide alloy, or compound semiconductor materials (e.g. Group III-V or Group II-VI compound semiconductor materials, etc.). Non-limiting examples of Group III-V compound semiconductor materials include gallium arsenide, indium arsenide, and indium phosphide. In another embodiment, the semiconductor substrate 100 comprises a SOI (silicon on insulator) substrate, which comprises an insulating layer (e.g., oxide layer) disposed between a base substrate layer (e.g., silicon substrate) and an active semiconductor layer (e.g., active Si or SiGe layer) in which active circuit components (e.g., FETs) are formed as part of a FEOL (front end of line) structure.

For illustrative purposes, FIG. 1A depicts the first device layer L1 comprising first and second FinFET devices M1 and M2. The first FinFET device M1 comprises the vertical semiconductor fin 110, the gate structure G1 disposed over a portion (i.e. channel region) of the vertical semiconductor fin 110, and the source/drain layers 140 and 141 (e.g., epitaxial semiconductor layers) disposed on portions (S/D regions) of the vertical semiconductor fin 110 which extend from sidewalls of the gate structure G1. Similarly, the second FinFET device M2 comprises the vertical semiconductor fin 110, the gate structure G2 disposed over a portion (i.e. channel region) of the vertical semiconductor fin 110, and the source/drain layers 141 and 142 (e.g., epitaxial semiconductor layers) disposed on portions (S/D regions) of the vertical semiconductor fin 110 which extend from sidewalls of the gate structure G2. In this exemplary embodiment, the FinFET devices M1 and M2 share a common source/drain region 141. It is to be understood that the term "source/drain layer" as used herein means that a given source/drain layer can be either a source layer or drain layer for the given FinFET device, depending on the application.

In one embodiment, the gate structures G1 and G2 comprise high-k metal gate structures which comprise high-k gate dielectric layers formed on exposed portions of the vertical semiconductor fin 110 within the gate regions, and metallic gate electrodes, which are formed using suitable dielectric and metallic materials. The gate structures G1 and G2 can be fabricated using any suitable replacement metal gate process flow, as is understood by one of ordinary skill in the art.

Although not specifically shown in FIG. 1A, the substrate 100 comprises an isolation layer (e.g. shallow trench isolation layer) to electrically isolate the FinFET devices M1 and M2 from the underlying bulk substrate and from other active elements formed on the first device layer L1. Furthermore, the FinFET devices M1 and M2 may comprise multi-fin devices wherein the gate structures G1 and G2 are extended (in the X-direction) to overlap one or more additional vertical semiconductor fins that are disposed parallel to the vertical semiconductor fin 110 of FIG. 1. In other embodiments, the first device layer L1 may comprise planar FET devices, or other types on non-planar (e.g., 3D) FET devices such as nanosheet or nanowire FET devices.

In one embodiment, the FinFET devices M1 and M2 are N-type devices. In another embodiment, the FinFET device M1 and M2 are P-type devices. In another embodiment, each device layer L1 and L2 may include both P-type and N-type devices to provide CMOS circuitry on each device layer L1 and L2. The type of epitaxial material and doping used to form the source/drain layers 140, 141, and 142 of the FinFET devices M1 and M2 will vary depending on whether the FinFET devices M1 and M2 are P-type or N-type devices. The source/drain layers 140, 141, and 142 formed by epitaxially growing crystalline semiconductor material on the exposed surfaces of the vertical semiconductor fin 110 using known techniques. For P-type devices, the source/drain layers 140, 141, and 142 may comprise epitaxial silicon-germanium (SiGe) layers, which are doped (e.g., in-situ during the epitaxial growth of the source/drain layers, or ex-situ by ion implantation) with a Group III element (e.g., Boron). For N-type devices, the source/drain layers 140, 141, and 142 may comprise epitaxial silicon phosphorous (SiP) layers, which are doped with a Group V element.

The vertical gate contact 150 comprises a MOL (middle of the line) contact to connect the metal gate electrode 120 of the gate structure G1 to the electrical interconnect 160. In one embodiment, the electrical interconnect 160 comprises an electrical line (or wire) to route electrical connections to and from the gate structure G1. The vertical source/drain contacts 152 and 154 comprise MOL contacts to connect the common source/drain layer 141 to the electrical interconnect 162. In one embodiment, the electrical interconnect 162 comprises a contact pad (or landing pad) to serves as a connection to an interlayer via contact formed in subsequent processing steps, as discussed in further detail below. The MOL contacts 150, 152 and 154, and the electrical interconnects 160 and 162 may comprise metallic fill material including, but not limited to, tungsten (W), cobalt (Co), ruthenium (Ru), copper (Cu), or combinations thereof, as well as thin liner layers (e.g., TiN and/or TaN barrier layer and/or seed layer) which are formed prior to depositing the metallic fill material In one embodiment, the vertical source/drain contact 152 may comprise a shared silicide trench contact, as is understood by one of ordinary skill in the art. In this example embodiment, the source/drain contact 152 (as a shared silicide trench contact) would comprise a silicide layer disposed between the source/drain layer 141 and the metallic fill material that forms the vertical contact 152. The silicide layer is formed by depositing a thin layer of a transition metal such as nickel (Ni), cobalt (Co), titanium (Ti), platinum (Pt), tungsten (W), tantalum (Ta), an alloy such as titanium-aluminum (TiAl) or titanium-nitride (TiN), etc., or any other suitable metallic material, on an exposed surface of the epitaxial source/drain layer 141 (or on an additional thin epitaxial semiconductor layer grown on the source/drain layer 141). A thermal anneal process is performed at an appropriate temperature to induce a reaction between the epitaxial material and the transition metal layer to form a metal-semiconductor alloy layer (or silicide layer). While not specifically shown in FIG. 1A, the vertical source/drain contact 152 may comprise a self-aligned contact that fully occupies the space between the sidewall spacers 122 and 132 of the adjacent gate structures G1 and G2, as is understood by one of ordinary skill in the art.

The insulating layer 170 is formed by depositing and patterning multiple layers of insulating material at different stages of fabrication of the first device layer L1. For example, the insulating layer 170 comprises a pre-metal deposition (PMD) insulating layer that is deposited an planarized down to the gate structures G1 and G2 (prior to a replacement metal gate process). The PMD layer is patterned to form contact openings that are filled with metallic material to form contacts (e.g., contact 152) to the source/drain layers 140, 141, and 142. The insulating layer 170 further comprises a first interlayer dielectric (ILD) layer that is deposited over the PMD layer and patterned to form contact openings which are filled with metallic material to form the MOL contacts 150 and 154. In addition, the insulating layer 170 comprises a second ILD layer that is deposited over the first ILD layer and patterned to form trench and via openings that are filled with metallic material to form the metallic interconnects 160 and 162.

The various layers of the insulating layer 170 can be formed using suitable dielectric materials including, but not limited to, silicon oxide, hydrogenated silicon carbon oxide (SiCOH), SiCH, SiCNH, or other types of silicon based low-k dielectrics (e.g., k less than about 4.0), porous dielectrics, or known ULK (ultra-low-k) dielectric materials (with k less than about 2.5). For example, the insulating layer 170 may comprise multiple layers of insulating material (e.g., a first layer of a flowable oxide and a second layer of insulating material formed on the first layer). The insulating layer 170 may be deposited using known deposition techniques, such as, for example, atomic layer deposition (ALD), chemical vapor deposition (CVD), PECVD (plasma-enhanced CVD), physical vapor deposition (PVD), or spin-on deposition.

The etch stop layer 180 is formed by depositing a conformal layer of dielectric material, such as silicon nitride (SiN), on a planarized surface of the first device layer L1 following formation of the metallic interconnects 160 and 162. As explained in further detail below, the etch stop layer 180 serves an etch stop layer when etching interlayer via contact openings through the stack of layers in the second (upper) device layer L2. In addition, the etch stop layer 180 serves as a protection layer to protect the metallic interconnect 162 from exposure during a subsequent epitaxial semiconductor deposition process to form epitaxial source drain layers for the FET devices M3 and M4 of the second device layer L2. In addition, the etch stop layer 180 serves as a capping layer as in standard BEOL interconnect structures in which dielectric capping layers are formed on the exposed upper surfaces of the metallic structures (e.g., wiring) which are formed as part of a metallization level.

The bonding layer 200 comprises one or more bonding layers (e.g., oxide layers) to bond the second device layer L2 (at an intermediate stage of fabrication) to the etch stop layer 180 of the first device layer L1. More specifically, in one embodiment, the intermediate semiconductor device structure shown in FIGS. 1A and 1B can be formed by fabricating the first (lower) device layer L1, and then bonding the nanosheet stack structure 210 for nanosheet devices (or a semiconductor substrate for, e.g., FinFET devices) to the etch stop layer 180 via bonding films (via suitable wafer handling, transfer, and bonding methods), and then fabricating the semiconductor devices of the second device layer L2.

For example, the epitaxial semiconductor layers N1-N5 of the nanosheet stack structure 210 can be epitaxially grown starting with a semiconductor substrate, followed by depositing a first bonding layer (e.g., oxide bonding layer) on the epitaxial semiconductor layer N1. A second bonding layer (e.g., oxide bonding layer) can be deposited on the etch stop layer 180 of the first device layer L1, and an oxide-oxide bonding process can be performed to molecularly bond the first and second oxide bonding layers together and thereby bond the nanosheet stack structure 210 to the first device layer L1. In this embodiment, the epitaxial semiconductor layer N5 would be initially formed from a starting semiconductor substrate, followed by sequentially growing the epitaxial semiconductor layers N4, N3, N2, and N1, with the bonding layer being deposited on the last formed epitaxial semiconductor layer N1.

In an alternate embodiment, a thin semiconductor substrate can be bonded to the etch stop layer 180 of the first device layer L1 (via oxide-to-oxide molecular bonding). The nanosheet stack structure 210 can then be fabricated from the thin semiconductor substrate after bonding to the first device layer. In this embodiment, the epitaxial semiconductor layer N1 would be formed from the semiconductor substrate, followed by sequentially growing the epitaxial semiconductor layers N2, N3, N4, and N5 at low temperature (e.g., less than 450 degrees C.).

For illustrative purposes, FIGS. 1A and 1B depict the second device layer L2 comprising nanosheet FET devices M3 and M4, which are partially fabricated. The nanosheet FET devices M3 and M4 are formed by patterning the nanosheet stack structure 210 to form active channel layers for the nanosheet FET devices M3 and M4. The nanosheet stack structure 210 comprises a stack of alternating semiconductor layers N1-N5, which comprise sacrificial nanosheet layers Ni, N3, N5, and active nanosheet channel layers N2 and N4, wherein each active nanosheet channel layer N2 and N4 is disposed between the sacrificial nanosheet layers in the nanosheet stack structure 210.

The stack of alternating semiconductor layers N1-N5 comprises epitaxial semiconductor layers that are sequentially grown on top of each other using known epitaxial semiconductor deposition methods. The type of materials that are utilized to form the epitaxial semiconductor layers N1-N5 will depend on various factors such as the type of nanosheet FET devices (p-type, or n-type) and the desired level of etch selectivity between the semiconductor layers, as well as the ability to provide sufficient lattice matching between the materials of the semiconductor layers to ensure proper (e.g., defect-free) epitaxial growth of the crystalline semiconductor layers N1-N5.

For example, in one embodiment, the active nanosheet channel layers N2 and N4 are formed of epitaxial silicon (Si), which is suitable to serve as semiconductor channel layers for the nanosheet FET devices M3 and M4. When the active nanosheet channel layers N2 and N4 are formed of crystalline Si, the sacrificial nanosheet layers N1, N3, and N5 (which serve as sacrificial layers that are subsequently etched away to release the active nanosheet channel layers N2 and N4) can be formed of an epitaxial silicon-germanium (SiGe) alloy. This allows the epitaxial SiGe material of the sacrificial nanosheet layers N1, N3, and N5 to be etched selective to the epitaxial Si material of the active nanosheet channel layers N2 and N4 in a subsequent process step to "release" the active nanosheet channel layers N2 and N4. In other embodiments, the active nanosheet channel layers N2 and N4 can be formed of an epitaxial SiGe material with a desired Ge concentration (optimized for device performance), and the sacrificial nanosheet layers N1, N3, and N5 can be formed of a sacrificial semiconductor material which can be etched selective to the active nanosheet channel layers N2 and N4. For example, the sacrificial nanosheet layers N1, N3, and N5 can be formed of a sacrificial semiconductor material such as Si or SiGe with a Ge concentration which is different from the Ge concentration of the SiGe material that forms the active nanosheet channel layers N2 and N4 (i.e., etch selectivity based on differing Ge concentration).

As shown in FIGS. 1A and 1B, the first and second gate structures DG1 and DG2 for the respective nanosheet FET devices M3 and M4 are disposed over portions (i.e. channel region) of the nanosheet stack structure 210, thereby defining source/drain regions R1, R2, and R3 adjacent to the gate structures DG1 and DG2. Furthermore, as specifically illustrated in FIG. 1B, the nanosheet stack structure 210 is patterned to define a width W (in the X-direction), which defines a channel width of the active nanosheet channel layers N2 and N4 for the nanosheet FET devices M3 and M4. In addition, the first and second gate structures DG1 and DG2 define a gate channel length L for the nanosheet FET devices M3 and M4, wherein the channel length L (in the Y-direction) is defined by the length portions of the nanosheet stack structure 210 between the inner surfaces of the sidewall spacers 222 and 232 of the gate structures DG1 and DG2.

While the gate structures DG1 and DG2 of the nanosheet FET devices M3 and M4 are shown in FIG. 1B as overlapping a single nanosheet stack structure 210, in other embodiments, the nanosheet FET devices M3 and M4 may comprises multi-nanosheet stack structures in which the gate structure DG1 and DG2 are extended (in the X-direction) to overlap one or more additional patterned nanosheet stack structures that are disposed parallel to the nanosheet stack structure 210 of FIG. 1B. In other embodiments, the FET devices M3 and M4 of the second device layer L2 may comprise other types on non-planar (e.g., 3D) FET devices such as FinFET devices or nanowire FET devices, etc.

As shown in FIGS. 1A and 1B, the gate structures DG1 and DG2 are encapsulated in the insulating layer 240. The sacrificial (dummy) gate layers 220 and 230 comprise, for example, a dummy gate oxide layer conformally formed over the channel region of the nanosheet stack structure 210 and a dummy polysilicon gate electrode layer which fills the gate region surrounded and defined by the gate sidewall spacers 222 and 232. The gate sidewall spacers 222 and 232, and the gate capping layers 224 and 234 are formed of materials such as SiN, silicon carbon nitride (SiCN), silicon oxynitride (SiON), boron nitride (BN), silicon boron nitride (SiBN), siliconborocarbonitride (SiBCN), silicon oxycarbonitride (SiOCN), or other similar materials, which have etch selectivity with respect to the insulating layer 240 and the sacrificial (or replacement) gate layers 220 and 230. The insulating layer 240 can be formed with the same or similar materials as the insulating layer 170 of the first device layer L1, as discussed above. A replacement metal gate process is performed at a later stage of the fabrication process to replace the sacrificial gate layers 220 and 230 with metal gate structures (e.g., high-k gate dielectric layers, work function metal layers, and metallic gate electrodes), as is known in the art.

Figure 2B:
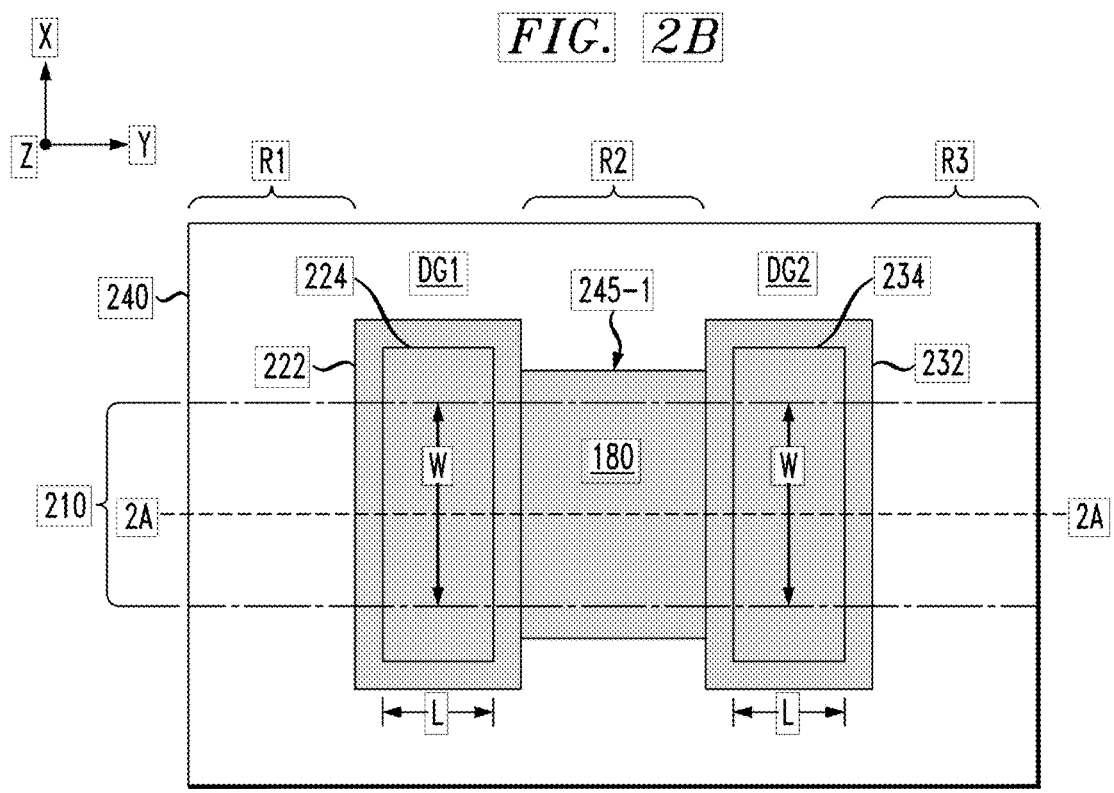
FIG. 2B is a schematic top plan view of the semiconductor device structure shown in FIG. 1A.
Figure 2A:
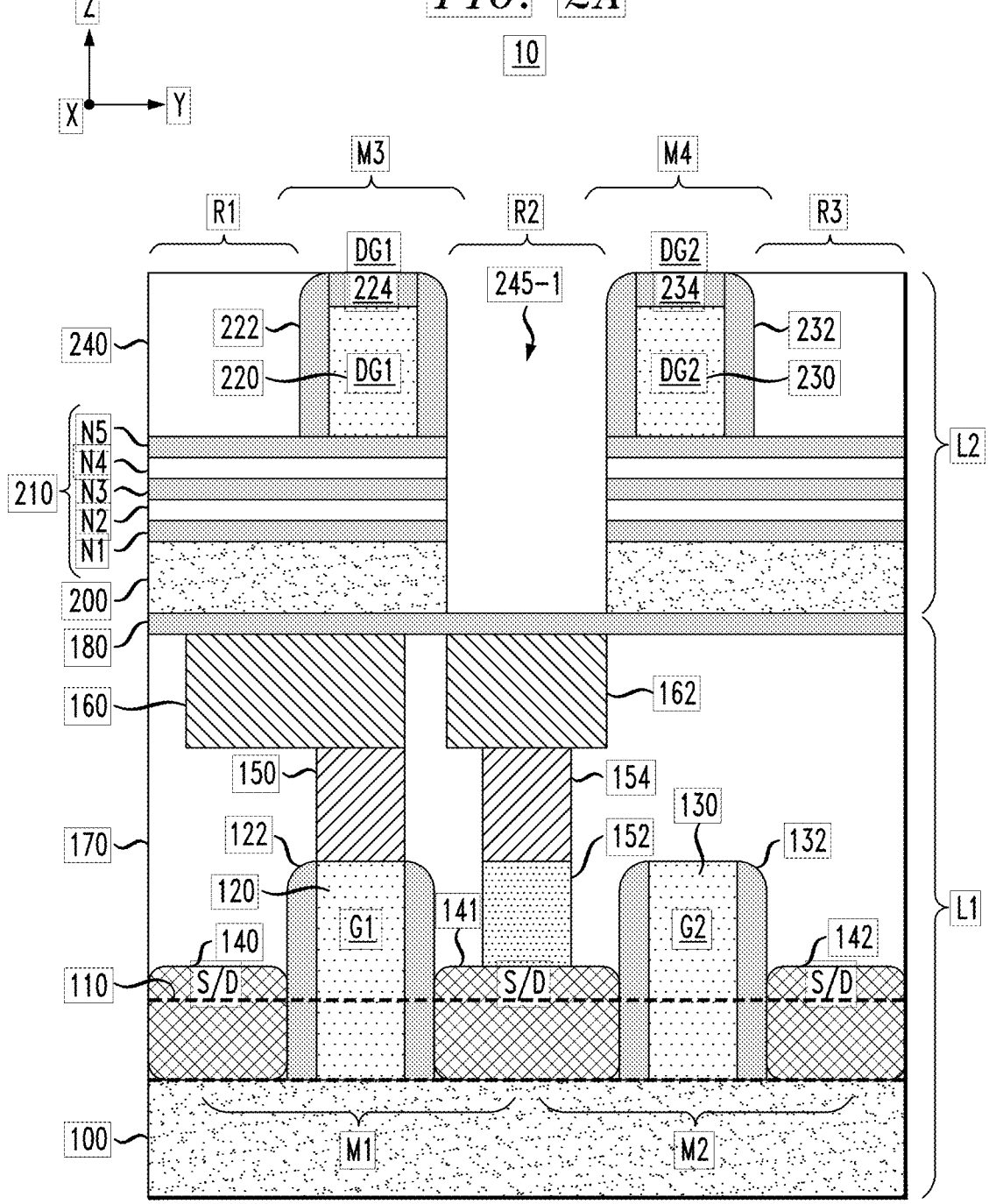
FIG. 2A is a schematic cross-sectional side view of the semiconductor device structure of FIG. 1A after etching an interlayer via contact opening within a source/drain region between adjacent gate structures of FET devices on the upper device layer down to an etch stop layer of the lower device layer.

A next phase of the fabrication process comprises forming an interlayer via contact which extends from the second device layer L2 to the first device layer L1 in the source/drain region R2 between the gate structures DG1 and DG1, using a process flow as schematically illustrated in FIGS. 2A-6. For example, FIGS. 2A and 2B are schematic views of a semiconductor device structure shown in FIGS. 1A and 1B, respectively, after etching a via contact opening 245-1 in the source/drain region R2 of the second device layer L2 down to the etch stop 180 of the first device layer L1. FIG. 2B is a top plan view (X-Y plane) of the resulting semiconductor device structure, and FIG. 2A is a cross-sectional view of the resulting semiconductor device structure along line 2A-2A shown in FIG. 2B. As shown in FIGS. 2A and 2B, the via contact opening 245-1 is formed by etching a contact opening through the insulating layer 240, the nanosheet stack structure 210, and the bonding layers 200 down to the buried etch stop layer 180 using known techniques.

For example, in one embodiment, the interlayer via contact opening 245-1 is patterned using a photolithographic process to form a photoresist mask (e.g., a multilayer photoresist stack structure) which comprises an opening that is aligned to the source/drain region R2 and which comprises an image of the via contact opening 245-1. One or more directional dry etch processes (e.g., reactive ion etch (ME)) are then performed to etch down the exposed portion of the insulating layer 240, the nanosheet stack structure 210, and the bonding layers 200, stopping on the etch stop layer 180. With this process, the gate sidewall spacers 222 and 232 of the gate structures DG1 and DG2 enable a self-aligned etch process in which the size of the via contact opening 245-1 is defined, in part, by the space between the gate sidewall spacers 222 and 232 of the gate structures DG1 and DG2, as schematically illustrated in FIGS. 2A and 2B. Therefore, the alignment budget of the photoresist mask is relaxed, as the dry etch processes (ME) are configured to etch the materials of the insulating layer 240, the nanosheet stack structure 210, and the bonding layers 200 selective to the materials of the gate sidewall spacers 222 and 232 and gate capping layers 224 and 234 of the gate structures DG1 and DG2.

It is to be noted that as schematically illustrated in FIGS. 2A and 2B, the portion of the nanosheet stack structure 210 within the source/drain region R2 between the gate structures DG1 and DG2 is completely removed to provide maximum space for the interlayer via contact that is subsequently formed. In other embodiments where the second device layer L2 comprises FinFET devices (instead of, or in addition to, the nanosheet FET devices M3 and M4), the portion of the vertical semiconductor fin (or vertical semiconductor fins for multi-fin FinFET devices) in the source/drain region R2 between the gate structures DG1 and DG2 would be completely etched away.

Figure 3:
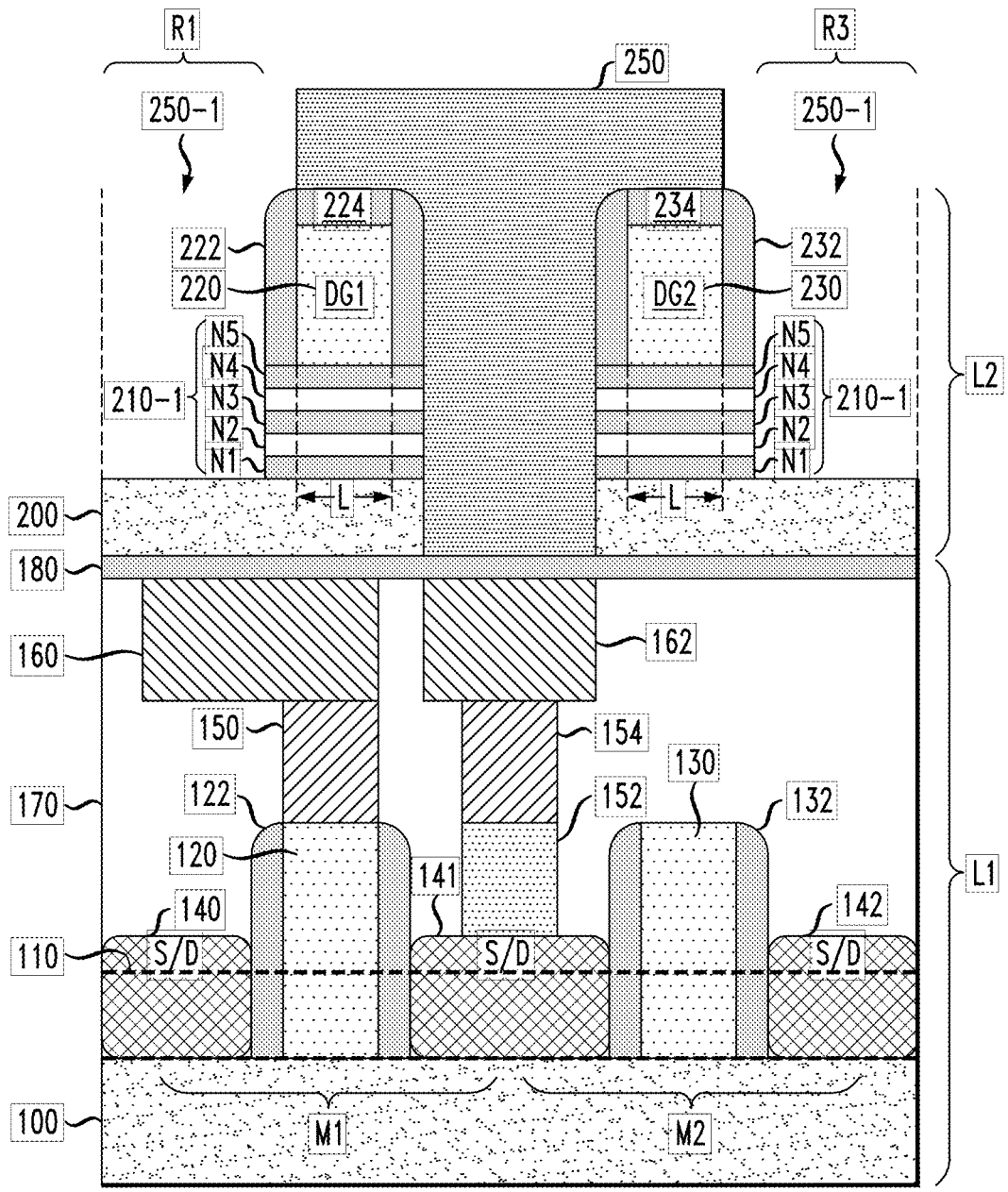

Next, FIG. 3 is a schematic cross-sectional side view of the semiconductor device structure shown in FIG. 2A after forming a photoresist mask 250 which fills the interlayer via contact opening 245-1 with photoresist material and which comprises openings to expose the source/drain regions R1 and R3 adjacent to the gate structures DG1 and DG2, and after etching exposed portions of the insulating layer 240 and nanosheet stack structure 210 down to the bonding layers 200 to form source/drain contact openings 250-1. With this process, the exposed portions of the nanosheet structure 210 in source/drain regions R1 and R3 are etched away, thereby forming separate nanosheet stack structures 210-1 for each nanosheet FET device M3 and M4. The etch process results in forming the separate nanosheet stack structures 210-1 with defined channel lengths L in the Y-direction (see, also FIGS. 1B and 2B) of the active nanosheet channel layers N2 and N4 of the resulting nanosheet stack structures 210-1. The width W in the X-direction (see FIGS. 1B and 2B) of the resulting nanosheet stack structures 210-1 is maintained since the sidewall surfaces of the nanosheet stack structures 210-1 which define the width W are covered by the gate structures DG1 and DG2.

Figure 4:
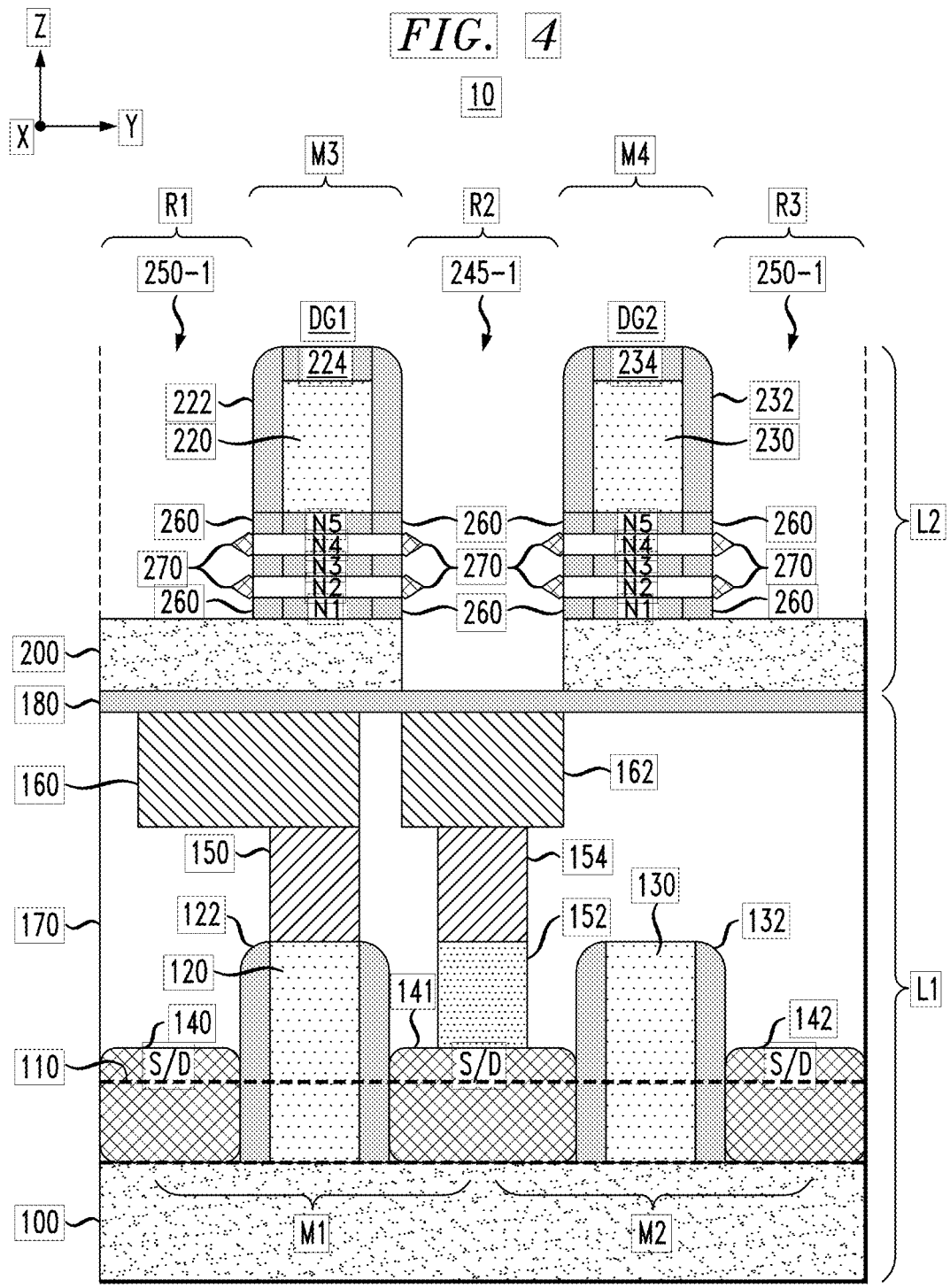

Next, FIG. 4 is a schematic cross-sectional side view of the semiconductor device structure of FIG. of FIG. 3 after removing the photoresist mask 250, and after forming inner spacers 260 and epitaxial source/drain layers 270 for the nanosheet FET devices M3 and M4. The material of the photoresist mask 250 (in FIG. 3) can be stripped away using a standard ashing process. In one embodiment, the inner spacers 260 are formed by a process which comprises laterally recessing exposed sidewall surfaces of sacrificial nanosheet layers N1, N3, and N5 of the nanosheet stack structures 210-1 to form recesses in the sidewalls of the nanosheet stack structures 210-1. As shown in FIG. 4, the exposed sidewall surfaces of the sacrificial nanosheet layers N1, N3, and N5 of the nanosheet stack structures 210-1 are laterally recessed to a depth (in the Y-direction) which is substantially equal to the thickness of the gate sidewall spacers 222 and 232.

In one embodiment of the invention, the lateral etch process can be performed using an isotropic wet etch process with an etch solution that is suitable to etch the semiconductor material (e.g., SiGe) of the sacrificial nanosheet layers N1, N3 and N5 of the nanosheet stack structures 210-1 selective to the semiconductor material (e.g., Si) of the active nanosheet channel layers N2 and N4, and the dielectric materials of the etch stop layer 180, and other exposed elements. In another embodiment, an isotropic dry plasma etch process can be performed to laterally etch the exposed sidewall surfaces of the sacrificial nanosheet layers N1, N3, and N5 selective to the active nanosheet channel layers N2 and N4, and the dielectric materials of the etch stop layer 180 and other exposed elements.

The recesses are then filled with dielectric material to the form inner spacers 260 (or embedded spacers) on the sidewalls of the nanosheet stack structures 210-1. In one embodiment, the inner spacers 260 are formed by depositing a conformal layer of dielectric material over the semiconductor device structure until the recesses are filled with dielectric material, followed by an etch back to remove the excess dielectric material. In one embodiment, the inner spacers 260 are formed of the same dielectric material used to form the gate sidewall spacers 222 and 232 of the gate structures DG1 and DG2. For example, the embedded gate insulating spacers 260 can be formed of SiN, SiBCN, SiCON, or any other type of dielectric material (e.g., a low-k dielectric material having a k of less than 5) which is commonly used to form insulating gate sidewall spacers of FET devices. In one embodiment, the dielectric material is conformally deposited using a highly conformal deposition process, such as ALD, to ensure that the recesses are sufficiently filled with dielectric material. Other deposition methods such as CVD and PVD can be utilized to deposit a highly conformal layer of dielectric material to fill the recesses. The conformal layer of dielectric material can be etched back using an isotropic wet etch process to remove the excess dielectric material on the sidewalls of the nanosheet stack structures 210-1 and expose the sidewalls of the active nanosheet channel layers N2 and N4, while leaving the dielectric material in the recesses to form the inner spacers 260. The wet etch process may include, but is not limited to, buffered hydrofluoric acid (BHF), diluted hydrofluoric acid (DHF), hydrofluoric nitric acid (HNA), phosphoric acid, HF diluted by ethylene glycol (HF/EG), hydrochloric acid (HCl), or any combination thereof.

Following formation of the inner spacers 260, the epitaxial source/drain layers 270 are formed by epitaxially growing semiconductor material (e.g., epitaxial Si material or SiGe material) on the exposed sidewall surfaces of the active nanosheet channel layers N2 and N4 of the nanosheet stack structures 210-1 using known epitaxial growth techniques which are suitable for the given process flow. The type of epitaxial semiconductor material that is used to form the source/drain layers 270 will vary depending on various factors including, but not limited to, the type of material of the active nanosheet channel layers N2 and N4, the device type (e.g., n-type or p-type) of the nanosheet FET device, etc. The epitaxial growth of the semiconductor material on the exposed sidewall surfaces of the active nanosheet channel layers N2 and N4 is performed to grow a sufficient amount of epitaxial semiconductor material, which does not consume a large amount of volume in the interlayer via contact opening 245-1. In this regard, in one embodiment, the epitaxial growth is terminated before merging of the epitaxial source/drain layers 270 on the vertical sidewalls of the nanosheet stack structures 210-1.

Furthermore, in one embodiment, the epitaxial source/drain layers 270 are doped using known techniques. For example, in one embodiment, the epitaxial source/drain layers 270 are "in-situ" doped during epitaxial growth by adding a dopant gas to the source deposition gas (i.e., the Si-containing gas). Exemplary dopant gases may include a boron-containing gas such as $BH_3$ for pFETs or a phosphorus or arsenic containing gas such as $PH_3$ or $AsH_3$ for nFETs, wherein the concentration of impurity in the gas phase determines its concentration in the epitaxially grown semiconductor material. In addition, in one embodiment of the invention, a thermal anneal process may be performed following the epitaxial growth of the doped epitaxial source/drain layers 270 to cause dopants to be injected into the end portions of the active nanosheet channel layers N2 and N4 that are in contact with the epitaxial semiconductor material of the source/drain layers 270. This process effectively results in extending the source/drain layers 270 into the semiconductor material of the end portions of the active nanosheet channel layers N2 and N4.

In the exemplary embodiment shown in FIG. 4, during the epitaxial deposition process, the etch stop layer 180 protects the underlying metallic interconnect 162 from being exposed to the epitaxial deposition environment, and protects the metallic interconnect 162 from damage or contamination which would otherwise result from exposure of the gases and materials of the epitaxial deposition environment. Furthermore, although not specifically shown in FIG. 4, prior to forming the epitaxial source/drain layers 270, an isolation layer can be formed on or within a recess of the exposed surface of the bonding layer 200 to provide isolation between the bonding layer 200 and source/drain contacts which are subsequently formed in the source/drain contact openings 250-1.

Figure 5:
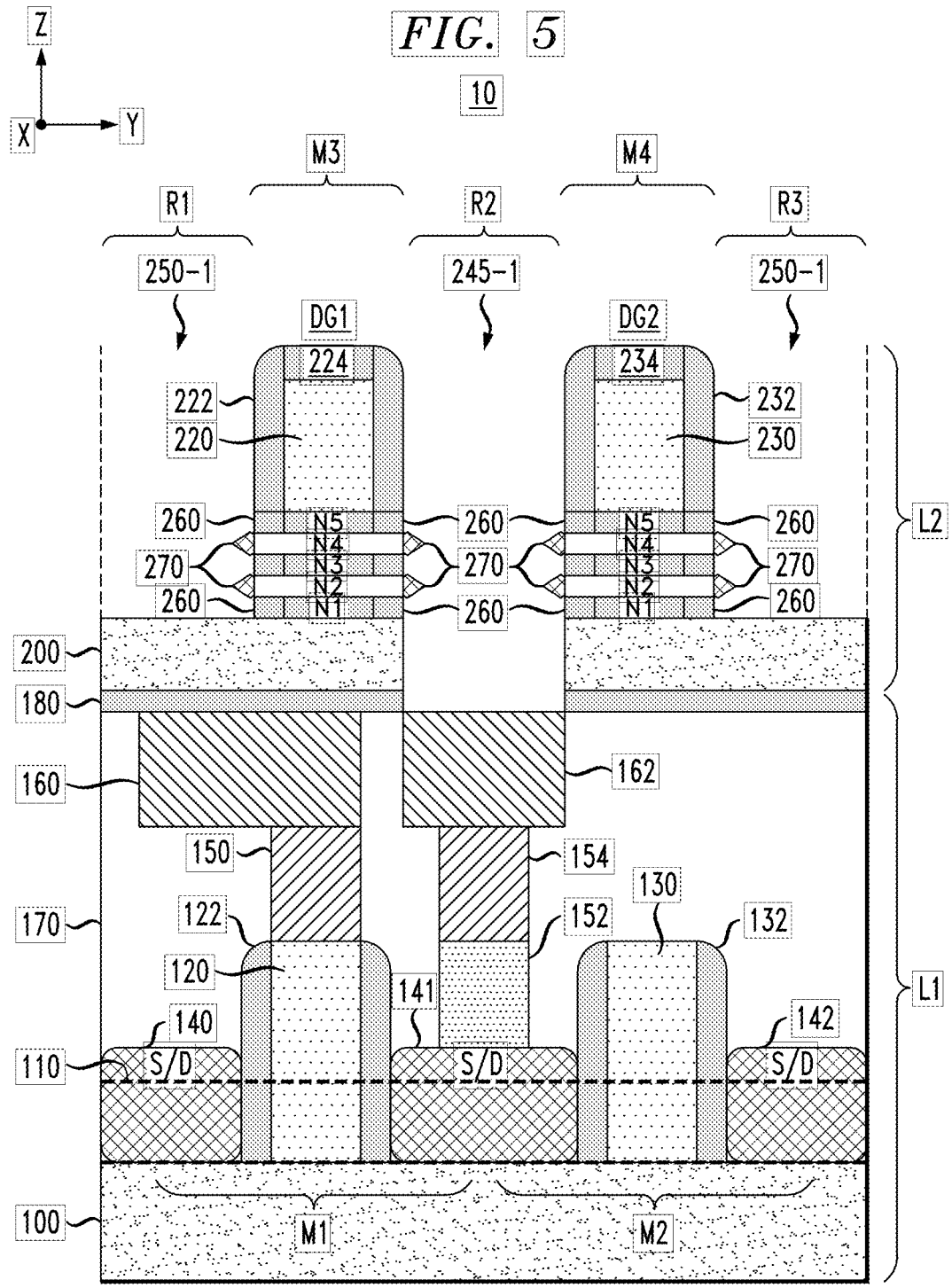

Next, FIG. 5 is a schematic cross-sectional side view of the semiconductor device structure of FIG. of FIG. 4 after removing a portion of the etch stop layer 180 exposed at a bottom of the interlayer via contact opening 245-1. In one embodiment, the exposed portion of the etch stop layer 180 is removed using a wet etch process with an etching solution that is configured to etch away the exposed material of the etch stop layer 180 selective to the epitaxial material of the source/drain layers 270, and the materials of other surrounding features. For example, in one embodiment, when formed of silicon nitride ($Si_3N_4$), the etch stop layer 180 can be etched away using a hot mixture of phosphoric acid ($H_3PO_4$) and water ($H_2O$) at a high temperature to etch silicon nitride selective to the materials of, e.g., the insulating layer 240 (e.g., silicon dioxide), the epitaxial material of the source/drain layers 270, and the dielectric materials of the gate sidewall spacers 222 and 232, the gate capping layers 224 and 234, and the inner spacers 260. In this instance, the dielectric materials of the gate sidewall spacers 222 and 232, the gate capping layers 224 and 234, and the inner spacers 260 are formed of dielectric materials such as, e.g., SiBCN, SiOCN, etc. which have etch selectivity with respect to the dielectric material of the etch stop layer 180.

In another embodiment, the exposed portion of the etch stop layer 180 can be etched away using a directional dry etch process (e.g., ME) with an etch chemistry (e.g., tetrafluoromethane ($CF_4$) or fluoromethane/oxide ($CH_3F/O_2$)) that is selective to the etch stop layer 180. In some embodiments, when there is no or little etch selectivity between the materials of the etch stop layer 180 and the gate capping layers 224 and 234 and gate sidewall spacers 222 and 232, the thickness of the gate capping layers 224 and 234 and the vertical heights of the gate sidewall spacers 222 and 232 can be made sufficient large so that even when such elements are recessed down during etch of the etch stop layer 180, a sufficient thickness of the gate capping layers 224 and 234 and a sufficient vertical height of the gate sidewall spacers 222 and 232 remains after the etch process.

In an alternate embodiment, the process of removing the portion of the etch stop layer 180 exposed at the bottom of the interlayer via contact opening 245-1 to expose the underlying metallic interconnect 162 (as shown in FIG. 5) can be performed prior to forming the epitaxial source/drain layers 270 on the exposed sidewall surfaces of the active nanosheet channel layers N2 and $N_4$ (as shown in FIG. 4). For example, a dedicated epitaxial tool can be used which allows metallic structures to be exposed in the epitaxial growth chamber without damaging the exposed surfaces of the metallic interconnect structures (e.g., metallic interconnect 162) during epitaxial growth of the source/drain layers 270.

Figure 6:
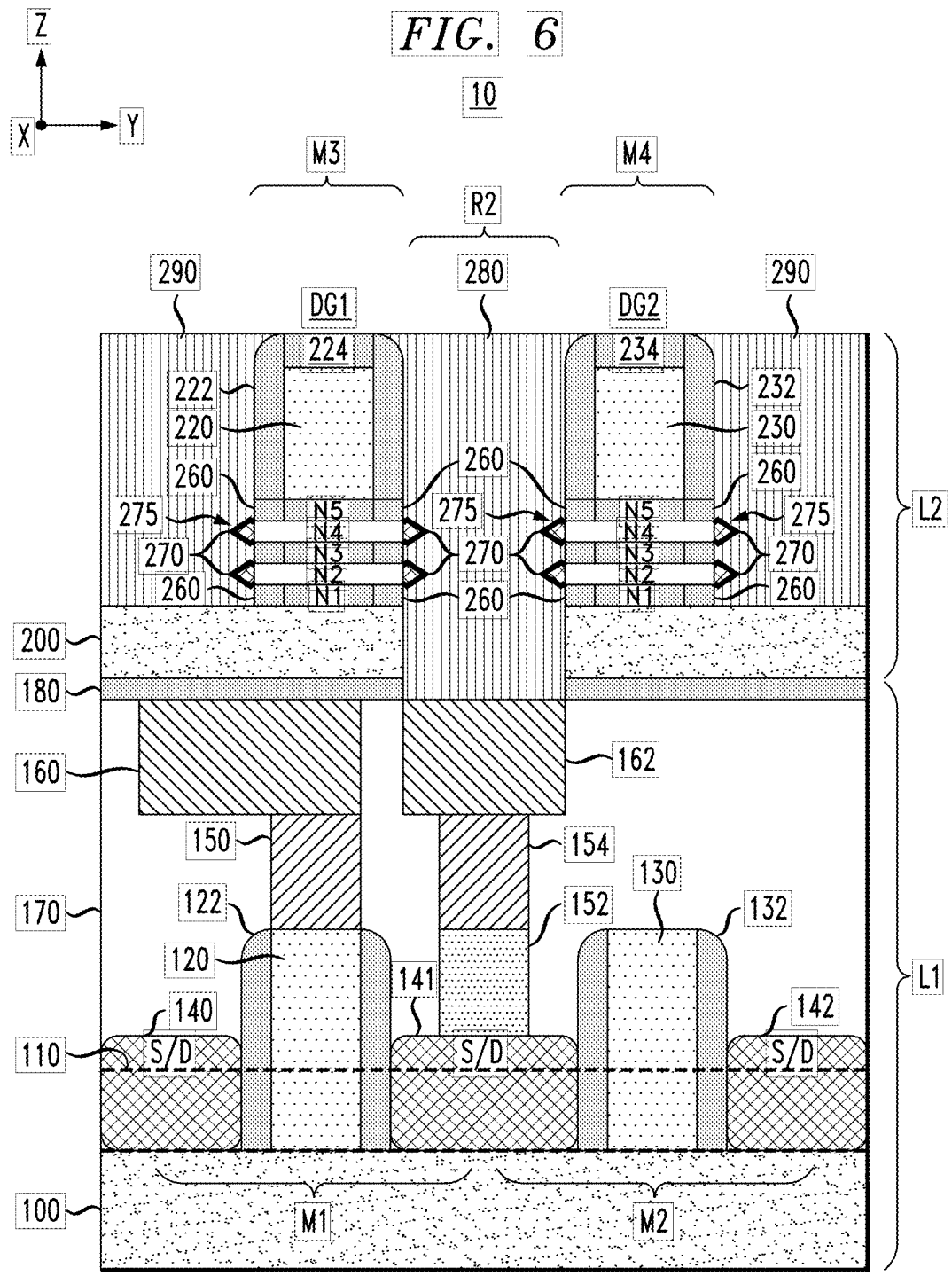

Next, FIG. 6 is a schematic cross-sectional side view of the semiconductor device structure of FIG. 5 after forming thin silicide layers 275 on the surfaces of the epitaxial source/drain layers 270, forming an interlayer via contact 280 in the interlayer via contact opening 245-1, and forming source/drain contacts 290 in the source/drain contact openings 250-1. The silicide layers 275 are formed by depositing a thin conformal layer of a transition metal such as nickel (Ni), cobalt (Co), titanium (Ti), platinum (Pt), tungsten (W), tantalum (Ta), an alloy such as titanium-aluminum (TiAl) or titanium-nitride (TiN), etc., or any other suitable metallic material, on exposed surfaces of the semiconductor device structure of FIG. 5, followed by a thermal anneal process which is performed at an appropriate temperature to induce a reaction between the epitaxial material of the epitaxial source/drain layers 270 and the transition metal layer to form metal-semiconductor alloy layers, or the silicide layers 275, on the surfaces of the source/drain layers 270. The non-reacted portions of the thin conformal layer of transition metal can be subsequently removed selective to the surrounding materials. In other embodiments, the non-reacted portion of the thin conformal layer of transition metal can be left in place to serve as a liner layer (e.g., diffusion barrier layer and/or seed layer) for a subsequent metal deposition process to fill the contact openings 245-1 and 250-1 to form the interlayer via contact 280 and source/drain contacts 290.

In one embodiment, following the salicidation process to form the silicide layers 275, one or more conformal layers of metallic material can be deposited to form a suitable liner layer (e.g., seed layer and/or diffusion barrier layer) such as a titanium (Ti) and/or titanium nitride (TiN) liner, to line the bottom and sidewall surfaces of the contact openings 245-1 and 250-1, followed by a metallic fill process to fill the contact openings 245-1 and 250-1 with a metallic material (e.g., cobalt, tungsten, ruthenium, etc.) to form the interlayer via contact 280 and source/drain contacts 290. A chemical-mechanical polish (CMP) process is then performed to planarize the surface of the semiconductor device structure down to the gate capping layers 224 and 234 of the gate structures DG1 and DG2 to remove the overburden metallic material that was deposited to form the interlayer via contact 280 and source/drain contacts 290, resulting in the semiconductor device structure shown in FIG. 6.

As shown in FIG. 6, the source/drain layers 270 (and associated silicide layers 275) of the nanosheet FET devices M3 and M4 are embedded within metallic material of the interlayer via contact 280. In this regard, the interlayer via contact 280 within the source/drain region R2 between the gate structures DG1 and DG2 serves as a common source/drain contact for the nanosheet FET devices M3 and M4. In addition, the interlayer via contact 280 is formed in contact with the underlying metallic interconnect 162 in the first device layer L1, which in turn is connected to the common source/drain layer 141 of the FinFET devices M1 and M2 through the vertical contacts 154 and 152. As such, FIG. 6 illustrates an exemplary embodiment in which common source/drain region 141 of the FinFET devices M1 and M2 is connected to the commonly connected source/drain layers 270 of the nanosheet FET devices M3 and M4 through the interlayer via structures 280. It is to be understood that FIG. 6 is merely an illustrative embodiment and that interlayer via structures formed in source/drain regions of FET devices in the second (upper) device layer L2 can be connected to underlying metallic interconnects in the first device layer L1 which are routed/connected to other device elements or contacts in the first (lower) device layer L1.

The resulting semiconductor device structure shown in FIG. 6 differs from conventional 3D monolithic designs in which interlayer via contacts are formed outside the active area of the FET devices, thereby consuming more area. In addition, the resulting semiconductor device structure shown in FIG. 6 differs from other 3D monolithic designs in which interlayer via contacts are formed within source/drain regions but where all or portions of the vertical semiconductor fins or nanosheet stack structures are present in the source/drain regions and, thus, are embedded within the interlayer via contacts. In such designs, the portions of the vertical semiconductor fins or nanosheet stack structures present in the source/drain regions provide physical obstructions which limit the ability to etch the interlayer via contact openings and fill the interlayer via contact openings with metallic material. This leads to reduced volume of metallization for the interlayer via contacts, and thus increased resistance of the conventional interlayer via contact structure.

In contrast, the exemplary fabrication methods as discussed herein according to embodiments of the invention are designed to etch away portions of the vertical semiconductor fins and/or nanosheet (or nanowire) stack structures within the source/drain layers when etching the interlayer via contact openings. As noted above, the integrated etch stop layer 180 is included in the lower device layer L1 to provide an etch stop layer when etching the interlayer via contact openings and to protect the lower metallization structures during epitaxial growth of the source/drain layers of the FET devices on the upper device layer L2 within the interlayer via contact openings. After forming the source/drain layers within the interlayer via contact openings, the interlayer via contact openings are filled with metallic material to form the interlayer via contacts with embedded source/drain layers. This process flow for fabricating the interlayer via contacts effectively increases the volume and/or area for the metallization of the interlayer via contacts, thus leading to decreased resistance and higher performance of the interlayer via contact structures, as compared to conventional designs.

Following the formation of the semiconductor device structure shown in FIG. 6, a replacement metal gate process is performed to replace the dummy gate layers 220 and 230 of the gate structures DG1 and DG2 with a metal gate using known techniques and materials. For example, the gate capping layers 224 and 234 are removed to expose the underlying dummy gate layers 220 and 230. The dummy gate layers 220 and 230 are then etched away to form open gate regions which expose a portion of the nanosheet stack structure 210-1 surrounded by the gate sidewall spacers 222 and 232. The sacrificial nanosheet layers N1, N3 and N5 that are exposed in the open gate regions are etched away selective to the active nanosheet channel layers N2 and N4 to release the active nanosheet channel layers N2 and N4 and form spaces above and below the active nanosheet channel layers N2 and N4. A conformal layer of gate dielectric material is deposited within the open gate regions to form conformal layers of gate dielectric material on exposed surfaces of the active nanosheet channel layers N2 and N4 within the open gate region, and the open gate regions are filled with a metallic material, such as a work function metal, wherein the work function metal fills the spaces above and below the active nanosheet channel layers N2 and N4. The work function metal in the upper portion of the gate regions can be recessed, followed by deposition of a lower resistance metallic material such as tungsten, cobalt, etc., to form a metal gate electrode within the gate regions.

In an alternate embodiment, the replacement metal gate process can be performed at some stage of the fabrication process prior to forming the interlayer via contact 280 and the source/drain contacts 290. For example, starting with the semiconductor device structure shown in FIG. 5, following formation of the epitaxial source/drain layers 270, a protective liner layer can be deposited on the exposed surfaces of the epitaxial source/drain layers 270, and then a sacrificial flowable oxide material can be deposited to fill the interlayer via contact opening 245-1 and the source/drain contact openings 250-1. Then, a replacement metal gate process as outlined above is performed to replace the dummy gate layers 220 and 230 with a high-k dielectric and metallic gate electrode. Following the replacement metal gate process, the sacrificial flowable oxide material is removed from the contact openings 245-1 and 250-1, the protective liner layer is removed to expose the source/drain layers 270, and the process flow continues with forming silicide layers 275 on the source/drain layers 270, and then forming the interlayer via contact 280 and source/drain contacts 290 as discussed above with reference to FIG. 6.

FIGS. 7-10 schematically illustrate a method for fabricating interlayer via contacts for a monolithic 3D semiconductor IC device, according to another embodiment of the invention. In some embodiments, the fabrication process schematically illustrated in FIGS. 7-10 utilizes the same or similar structures, materials, deposition techniques, and patterning techniques for the fabrication process described above for FIGS. 1A-6. Thus, for ease and brevity of explanation, such details will not be repeated below.

Figure 7:
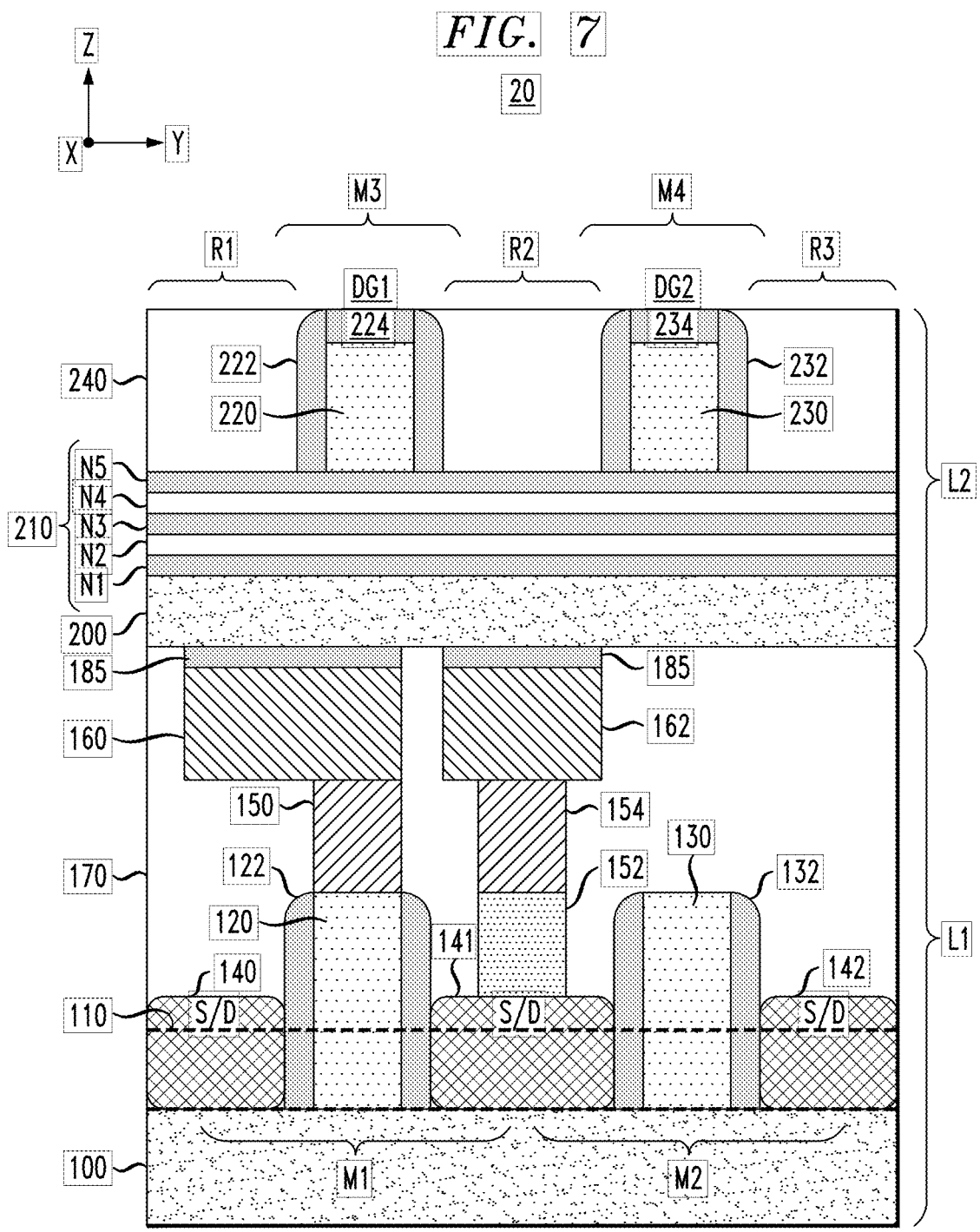

To begin, FIG. 7 is a schematic cross-sectional side view (Y-Z plane) of a semiconductor device structure 20 at an intermediate stage of fabrication comprising a first device layer L1 (or lower layer) and a second device layer L2 (or upper layer) which are bonded together. The intermediate semiconductor device structure 20 of FIG. 7 is similar in structure and materials to the intermediate semiconductor device structure 10 shown and discussed above with reference to FIGS. 1A and 1B, except that in the exemplary embodiment of FIG. 7, etch stop layers 185 are formed on recessed surfaces of the metallic interconnect structures 160 and 162. This is in contrast to the embodiment shown in FIG. 1A, where the etch stop layer 180 is formed on the entire surface of the insulating layer 170. The embodiment shown in FIG. 7 eliminates the need for a continuous etch stop layer 180 (e.g., SiN layer) which has a relatively higher dielectric constant (k) than the insulating layer, thus, providing for a reduced parasitic capacitance between the device layers L1 and L2.

In one embodiment, the etch stop layers 185 in FIG. 7 are formed by a process which comprises (i) performing an etch process to recess the upper surfaces of the metallic interconnect structures 160 and 162 down to a target depth, and (ii) depositing a dielectric material to fill the recessed regions above the recessed surfaces of the metallic interconnections 160 and 162. The etch stop layers 185 are formed using the same or similar materials as the etch stop layer 180 (FIG. 1A) as discussed above. For example, depending on the application, the etch stop layers 185 can be formed of a silicon nitride (SiN), silicon carbon nitride (SiCN), silicon oxynitride (SiON), boron nitride (BN), silicon boron nitride (SiBN), siliconborocarbonitride (SiBCN), silicon oxycarbonitride (SiOCN), or other similar materials.

In one embodiment, the etch stop layers 185 can be formed by depositing a conformal layer of insulating/dielectric material to fill the recessed regions above the recessed surfaces of the metallic interconnect structures 160 and 162, followed by a planarization process (e.g., CMP) to remove the overburden dielectric material down to the upper surface of the insulating layer 170. In another embodiment, the etch stop layers 185 can be selectively grown on top of the recessed surfaces of the metallic interconnect structures 160 and 162 using known selective deposition techniques. In this process, the insulating/dielectric material is selectively deposited on the recessed surfaces of the metallic interconnect structures 160 and 162, and not deposited on the planarized surface of the insulating layer 170.

Figure 8:
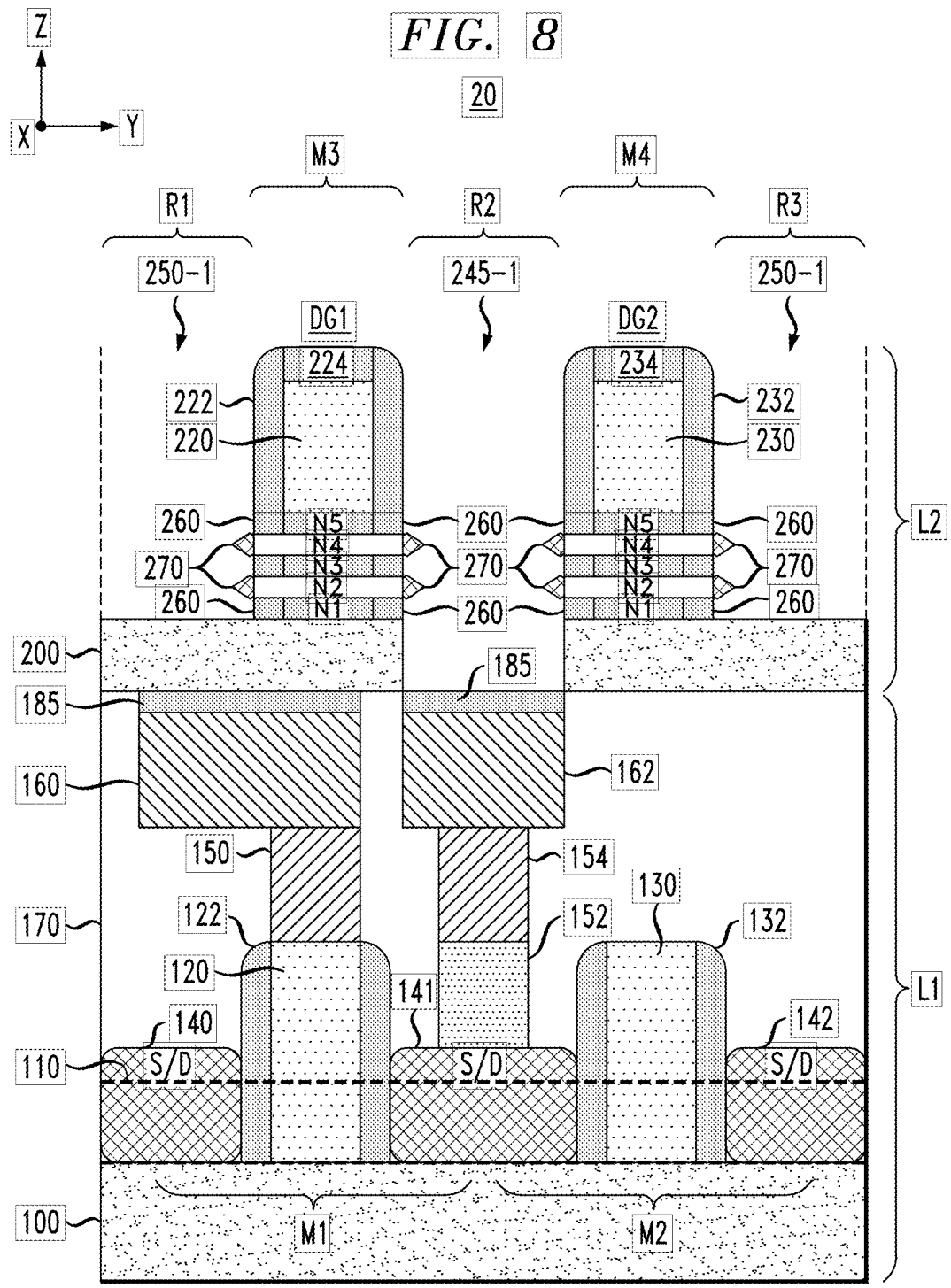

Next, FIG. 8 is a schematic cross-sectional side view of the semiconductor device structure of FIG. 7 after forming an interlayer via contact opening 245-1, source/drain contact openings 250-1, and inner spacers 260, and source/drain layers 270. In one embodiment, the semiconductor device structure in FIG. 8 is fabricated using the same or similar process flow as schematically illustrated and discussed above in conjunction with FIGS. 2A, 2B, 3, and 4, the details of which will not be repeated. In the example embodiment of FIG. 8, the etch stop layer 185 serves as an etch stop layer when etching the interlayer via contact opening 245-1 and serves to protect the metallic interconnect structure 162 during epitaxial growth of the source/drain layers 270 within the interlayer via contact opening 245-1.

Figure 9:
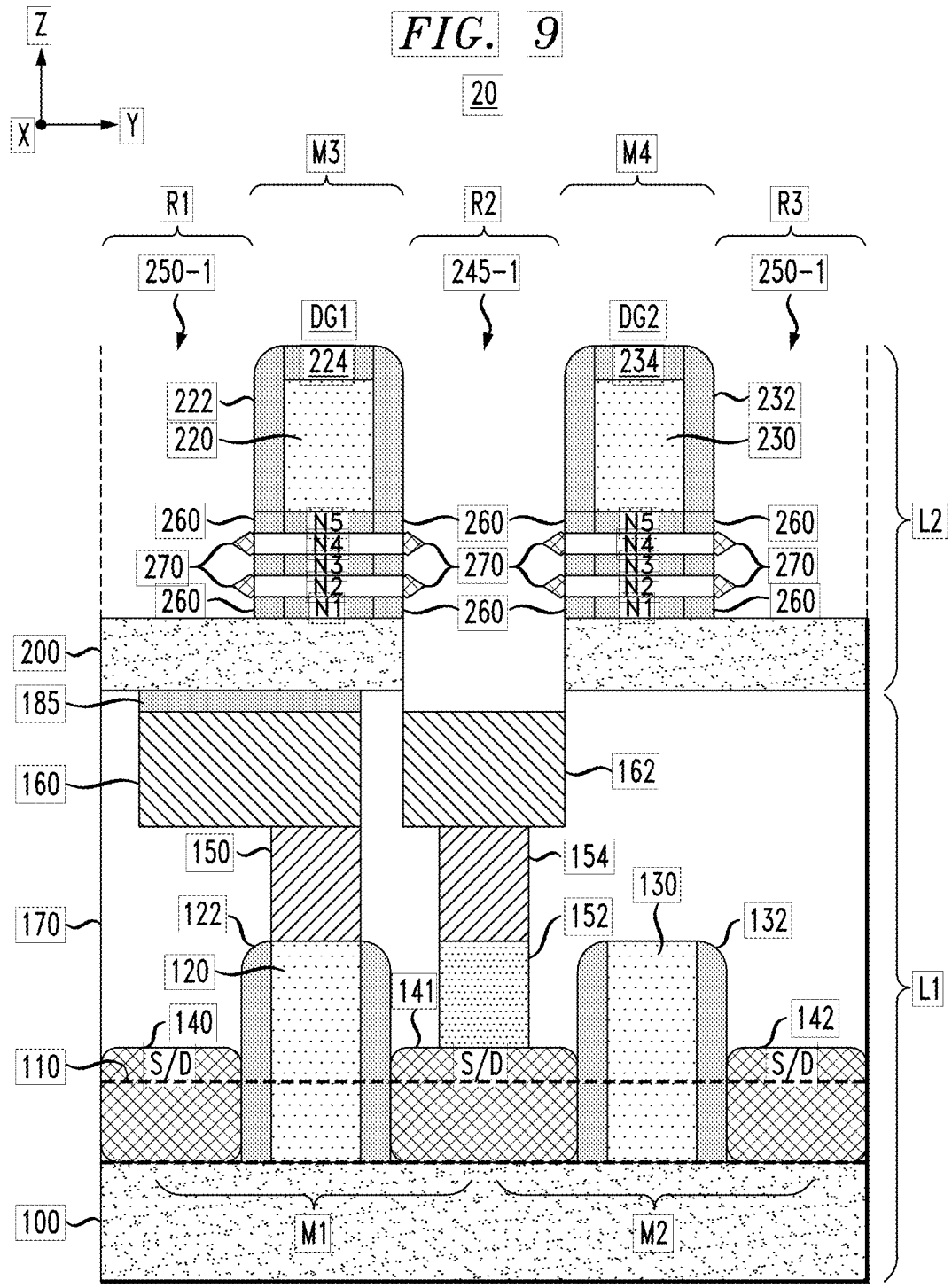

Next, FIG. 9 is a schematic cross-sectional side view of the semiconductor device structure of FIG. 8 after removing the etch stop layer 185 exposed at the bottom of the interlayer via contact opening 245-1. In one embodiment, the etch stop layer 185 is removed using the same or similar methods as discussed above in conjunction with FIG. 5 for removing the exposed portion of the buried etch stop layer 180, the details of which will not be repeated. In an alternate embodiment, as noted above, the etch stop layer 185 can be removed from the surface of the metallic interconnect 162 prior to forming the epitaxial source/drain layers 270.

Figure 10:
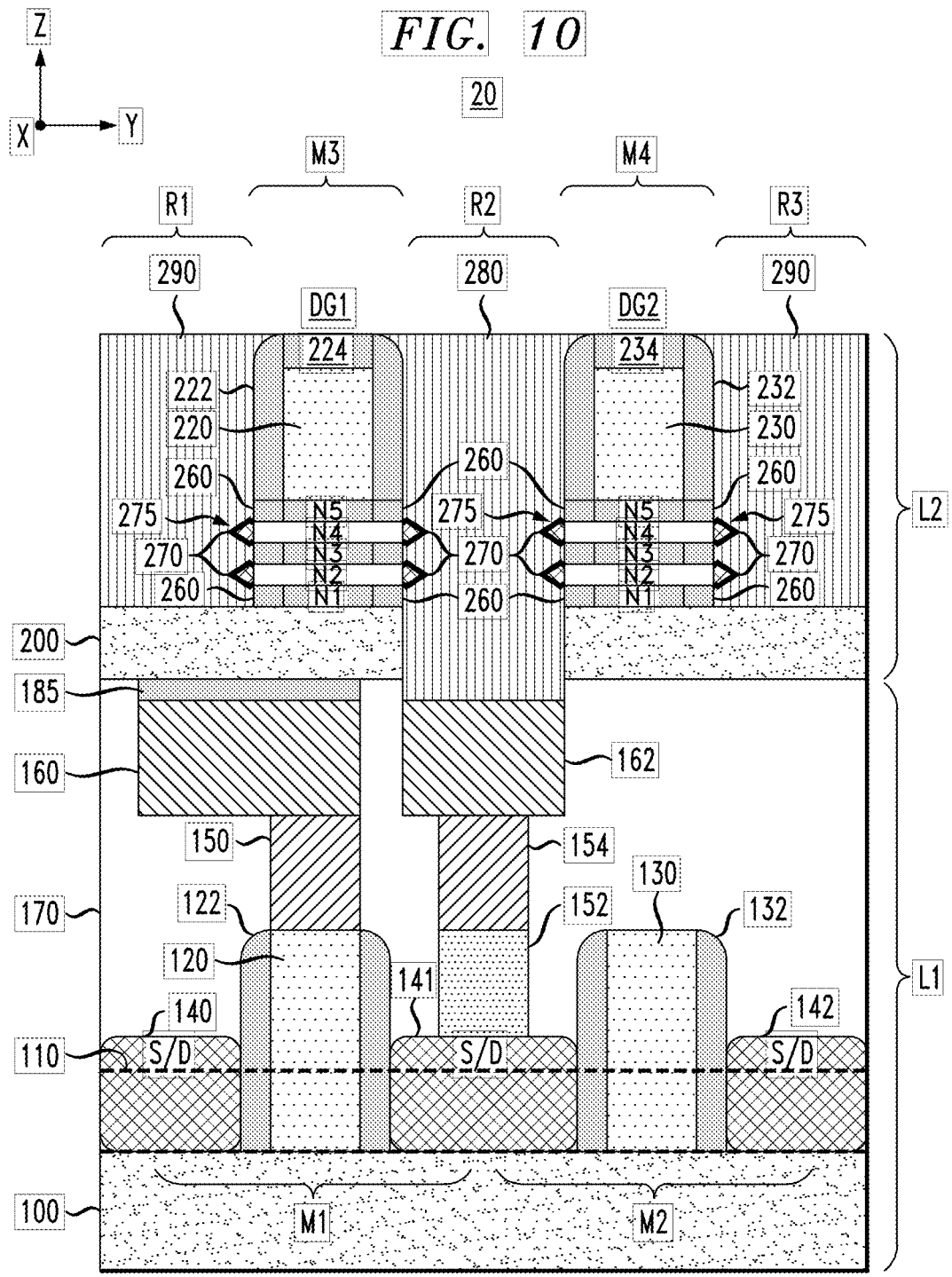

FIG. 10 is a schematic cross-sectional side view of the semiconductor device structure of FIG. 9 after forming thin silicide layers 275 on the surfaces of the epitaxial source/drain layers 270, forming an interlayer via contact 280 in the interlayer via contact opening 245-1, and forming source/drain contacts 290 in the source/drain contact openings 250-1. In one embodiment, the silicide layers 275, the interlayer via contact 280, and the source/drain contacts 290 are formed using the same or similar materials and fabrication techniques for constructing the intermediate device structure shown in FIG. 6 as discussed above, the details of which will not be repeated. Following the formation of the semiconductor device structure shown in FIG. 10, a replacement metal gate process is performed to replace the dummy gate layers 220 and 230 of the gate structures DG1 and DG2 with a metal gate using known techniques and materials.

FIGS. 11-14 schematically illustrate a method for fabricating interlayer via contacts for a monolithic 3D semiconductor IC device 30, according to yet another embodiment of the invention. In some embodiments, the fabrication process schematically illustrated in FIGS. 11-14 utilizes the same or similar structures, materials, deposition techniques, and patterning techniques for the fabrication process described above for FIGS. 1A-10. Thus, for ease and brevity of explanation, such details will not be repeated below.

Figure 11:
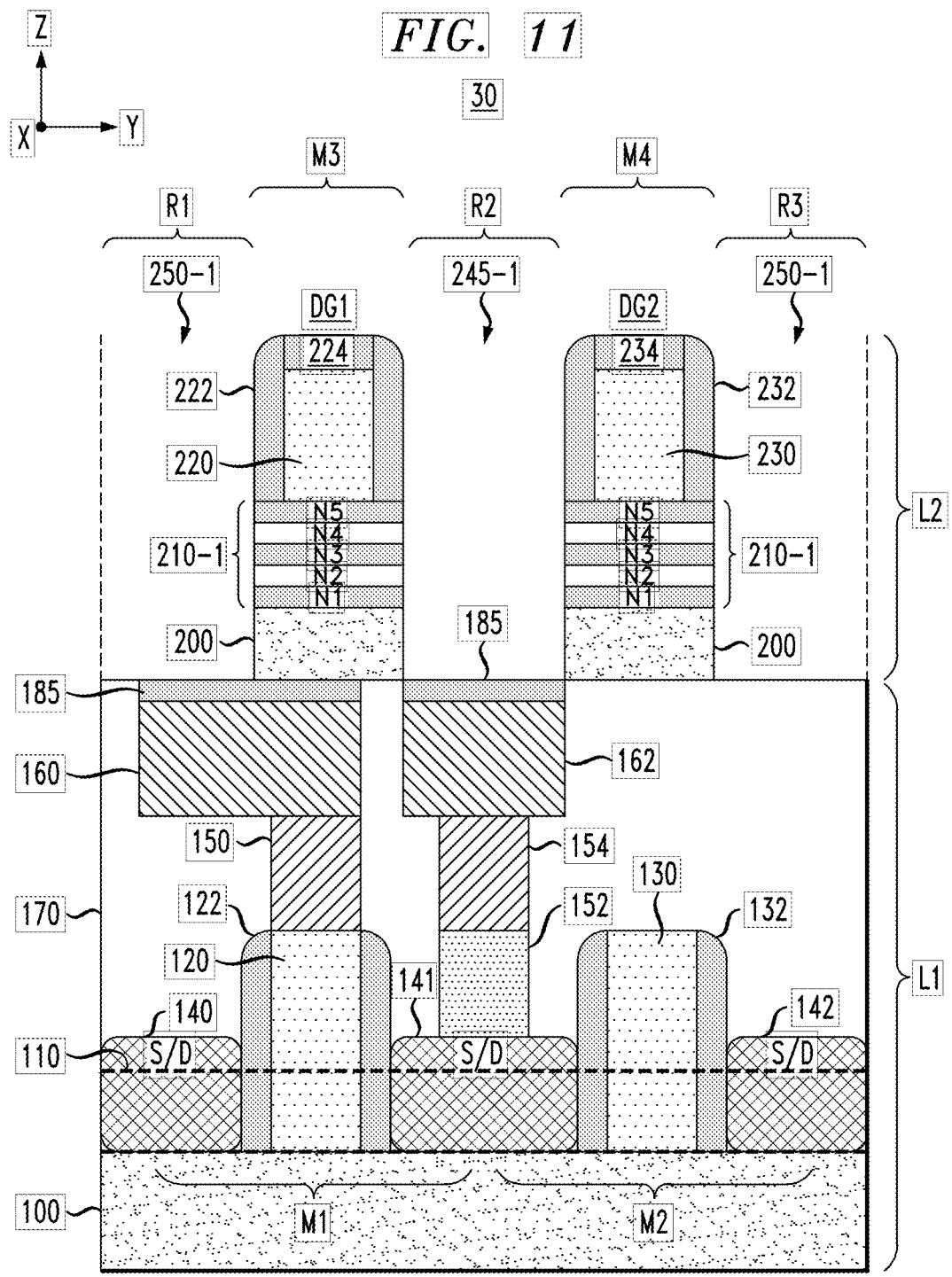

To begin, FIG. 11 is a schematic cross-sectional side view of the semiconductor device structure 30 (starting at an intermediate stage of fabrication as shown in FIG. 7) after concurrently forming an interlayer via contact opening 245-1, and source/drain contact openings 250-1. In contrast to the example embodiments discussed above (e.g., FIGS. 2A, 2B, 3 and 4) wherein the interlayer via contact opening 245-1 is initially formed, and then subsequently filled with photoresist material of a photoresist mask which is used to pattern the source/drain contact openings 250-1, an etch process is performed on the intermediate semiconductor device structure of FIG. 7 to etch exposed portions of the insulating layer 240, and the underlying nanosheet stack structures 210 and bonding layer 200 in the source/drain regions R1, R2, and R3 to concurrently pattern and form the source/drain contact openings 250-1 and the interlayer via contact opening 245-1, as shown in FIG. 11. In the example embodiment shown in FIG. 11, the source/drain contact openings 250-1 are formed down to the upper surface of the first device layer L1 to expose the etch stop layers 185 and the upper surface of the insulating layer 170 of the first device layer L1. This is in contrast to the example embodiments discussed above (e.g., FIGS. 3, and 8) where the source/drain contact openings 250-1 are formed down the substrate 200 of the second device layer L2.

Figure 12:
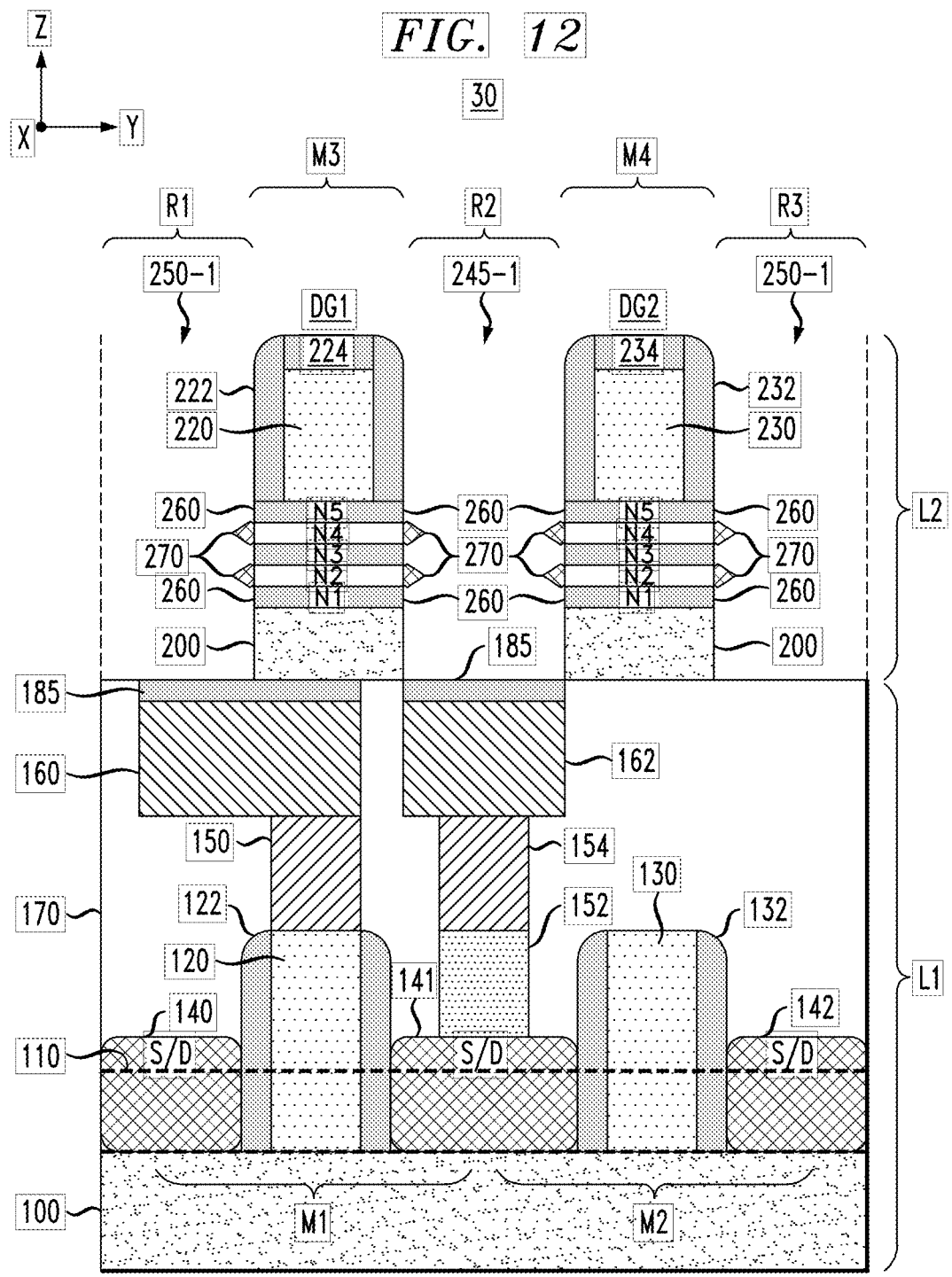

Next, FIG. 12 is a schematic cross-sectional side view of the semiconductor device structure of FIG. 11 after the forming inner spacers 260 and source/drain layers 270 on the sidewalls of the nanosheet stack structures 210-1 of the nanosheet FET devices M3 and M4. In one embodiment, the semiconductor device structure of FIG. 12 is fabricated using the same or similar process flow as schematically illustrated and discussed above in conjunction with FIG. 4, the details of which will not be repeated. In the example embodiment of FIG. 12, the etch stop layers 185 serve as etch stop layers when etching the interlayer via contact opening 245-1 and the source/drain contact openings 250-1, and also serve to protect the metallic interconnect structures 160 and 162 during epitaxial growth of the source/drain layers 270 within the interlayer via contact opening 245-1 and source/drain contact openings 250-1.

Figure 13:
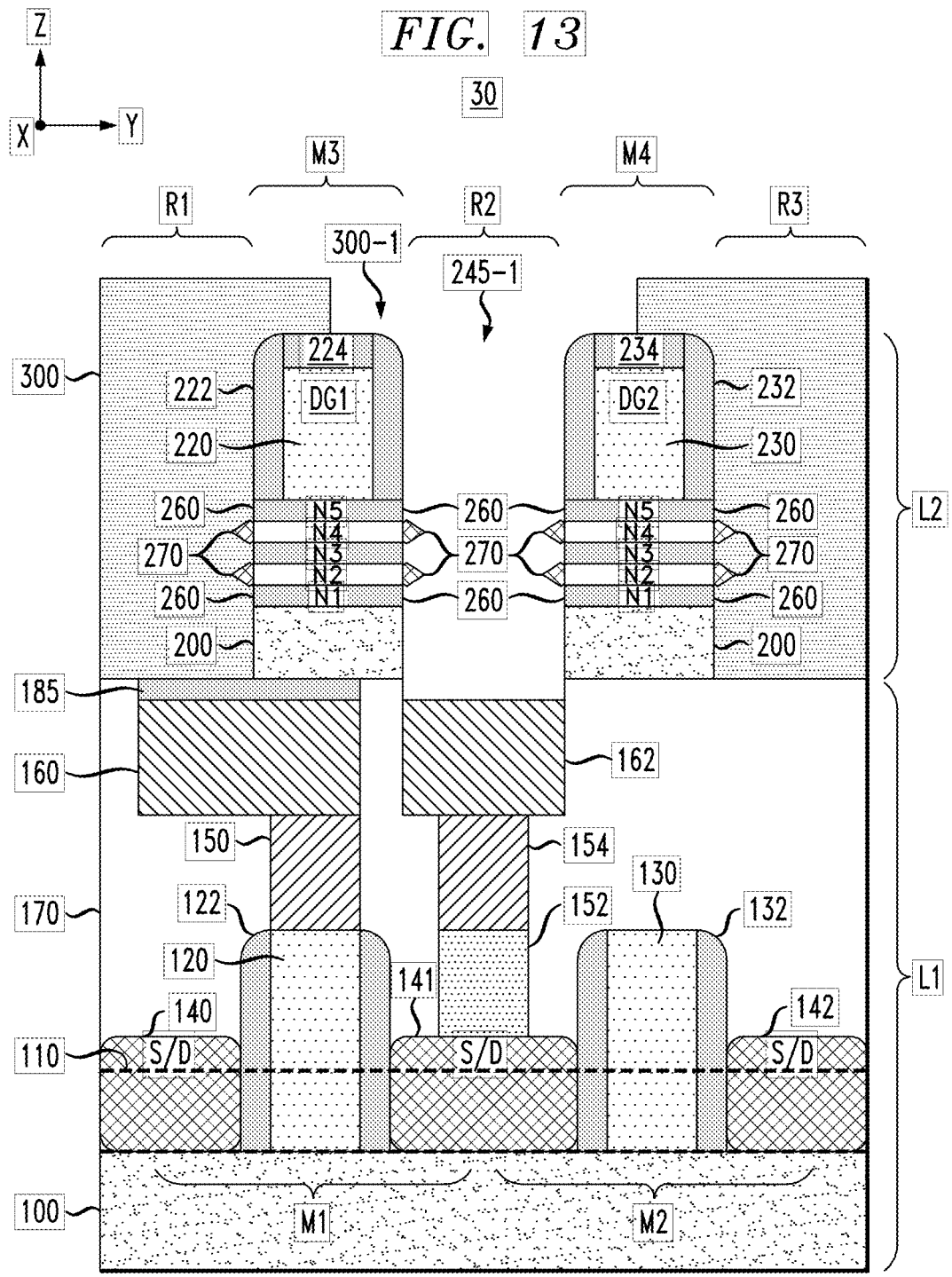

Next, FIG. 13 is a schematic cross-sectional side view of the semiconductor device structure of FIG. 12 after removing the etch stop layer 185 exposed at the bottom of the interlayer via contact opening 245-1. In one embodiment, the etch stop layer 185 is removed using a process flow which comprises (i) forming a photoresist mask 300 comprising photoresist material which fills the source/drain contact opening 250-1, and which comprises an opening 300-1 that exposes the interlayer via contact opening 245-1 in the source drain region R2, and (ii) selectively removing the exposed etch stop layer 185 at the bottom of the interlayer via contact opening 245-1. With this process, the photoresist mask 300 provides a block mask to fill the source/drain contact openings 250-1 with photoresist material to block/prevent etching of the etch stop layer 185 and other layers at the bottom of the source/drain contact openings 250-1.

The etch stop layer 185 at the bottom of the interlayer via contact opening 245-1 is selectively etched away using, for example, a wet etch process which etches the material of the etch stop layer 185 selective to the materials of the gate capping layers 224 and 234, the gate sidewall spacers 222 and 232, the inner spacers 260, and the epitaxial source/drain layers 270. In this regard, as shown in FIG. 13, the alignment budget of the photoresist mask 300 is relaxed (e.g., opening 300-1 can overlap gate capping layers 224 and 234), as the etch process is configured to remove the etch stop layer 185 selective to the exposed portions of the gate capping layers 224 and 234, and the gate sidewall spacers 222 and 232 of the gate structures DG1 and DG2. In an alternate embodiment, as noted above, the etch stop layer 185 in FIG. 12 can be removed from the surface of the metallic interconnect 162 prior to forming the epitaxial source/drain layers 270.

Figure 14:
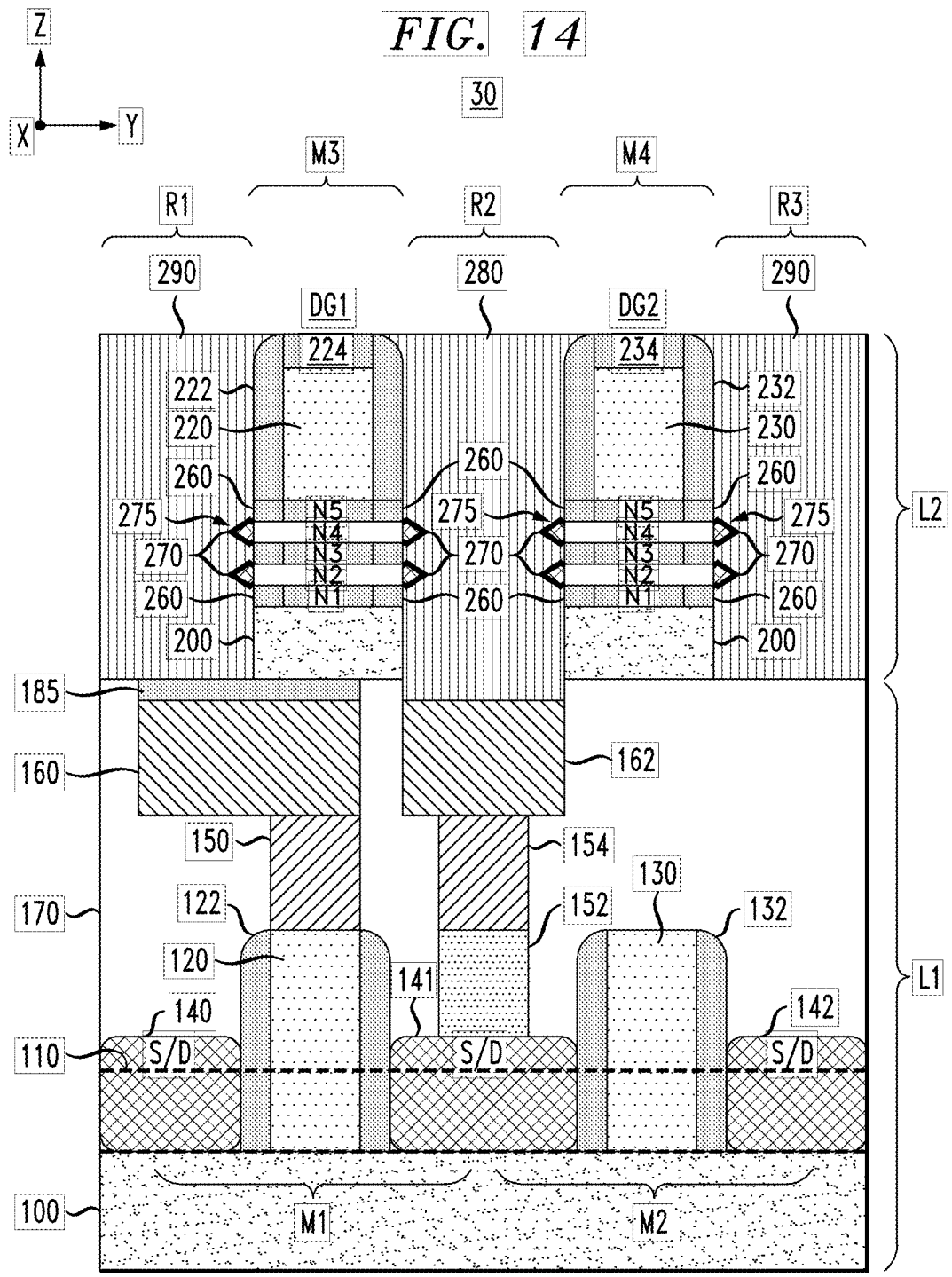

Next, FIG. 14 is a schematic cross-sectional side view of the semiconductor device structure of FIG. 13 after forming thin silicide layers 275 on the surfaces of the epitaxial source/drain layers 270, forming an interlayer via contact 280 in the interlayer via contact opening 245-1, and forming source/drain contacts 290 in the source/drain contact openings 250-1. In one embodiment, the silicide layers 275, the interlayer via contact 280, and the source/drain contacts 290 are formed using the same or similar materials and fabrication techniques for constructing the intermediate device structure shown in FIG. 6 as discussed above, the details of which will not be repeated. In the exemplary embodiment shown in FIG. 14, the source/drain contacts 290 are isolated from metallic interconnects structure 160 by the etch stop layer 185 and from the insulating layer 170 by the liner layers (e.g., diffusion barrier layers) that are formed to line the bottom and sidewall surfaces of the contact openings 250-1 prior to the metal fill process to form the source/drain contacts 290. Following the formation of the semiconductor device structure shown in FIG. 14, a replacement metal gate process is performed to replace the dummy gate layers 220 and 230 of the gate structures DG1 and DG2 with metal gates using known techniques and materials.

FIGS. 15-18 schematically illustrate a method for fabricating interlayer via contacts for a monolithic 3D semiconductor IC device, according to another embodiment of the invention. In some embodiments, the fabrication process schematically illustrated in FIGS. 15-19 utilizes the same or similar structures, materials, deposition techniques, and patterning techniques for the fabrication process described above for FIGS. 1A-14. Thus, for ease and brevity of explanation, such details will not be repeated below.

Figure 15:
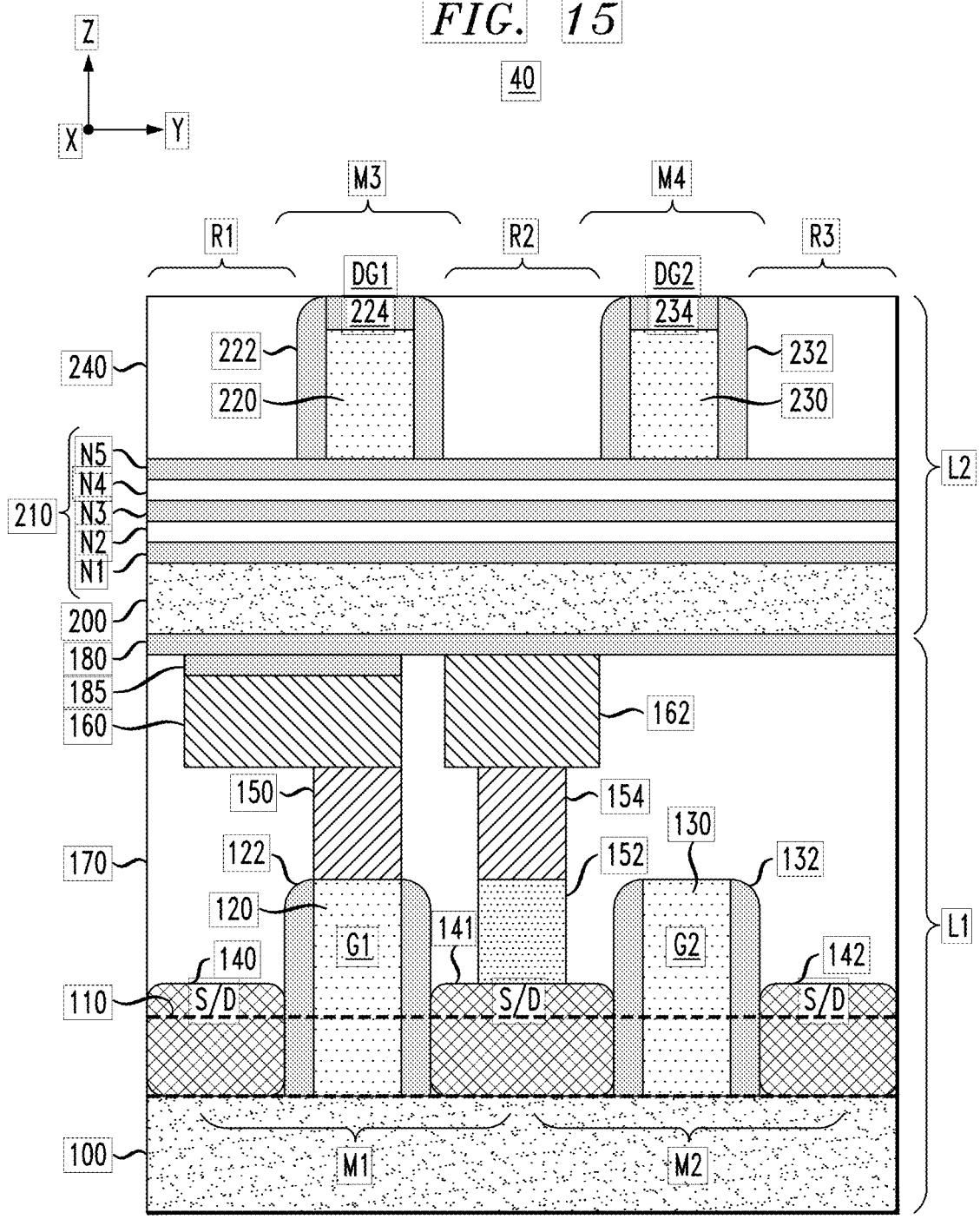

To begin, FIG. 15 is a schematic cross-sectional side view of a semiconductor device structure 40 at an intermediate stage of fabrication comprising a first device layer L1 (or lower layer) and a second device layer L2 (or upper layer) which are bonded together. The intermediate semiconductor device structure 40 of FIG. 15 is similar in structure and materials to the intermediate semiconductor device structures 10 and 20 shown and discussed above with reference to FIGS. 1A and 1B, and FIG. 7, wherein an etch stop layer 180 is formed on the entire surface of the insulating layer 170, and wherein an etch stop layer 185 is formed on a recessed surface of the metallic interconnect structure 160. In this regard, the exemplary embodiment shown in FIG. 15, the metallic interconnect structures (e.g., metallic interconnect 160) which do not contact interlayer via structures (i.e., non-interlayer via locations) are initially covered by a dual etch stop layer. The etch stop layer 185 can be fabricated using methods as discussed above, wherein the metallic interconnect structures (e.g., metallic interconnect 160) in non-interlayer via locations are recessed, followed by formation of the etch stop layers 185 on the recessed surfaces of the metallic interconnect structures. The blanket etch stop layer 180 is then formed on the entire planarized surface of the insulating layer 170, covering the metallic interconnection structures (e.g., metallic interconnect structure 162) that are disposed in locations where interlayer via contacts are to be formed, and covering the etch stop layers 185 disposed on recessed surfaces of the metallic interconnect structures (e.g., metallic interconnect structure 160) that are disposed in non-interlayer via locations.

Figure 16:
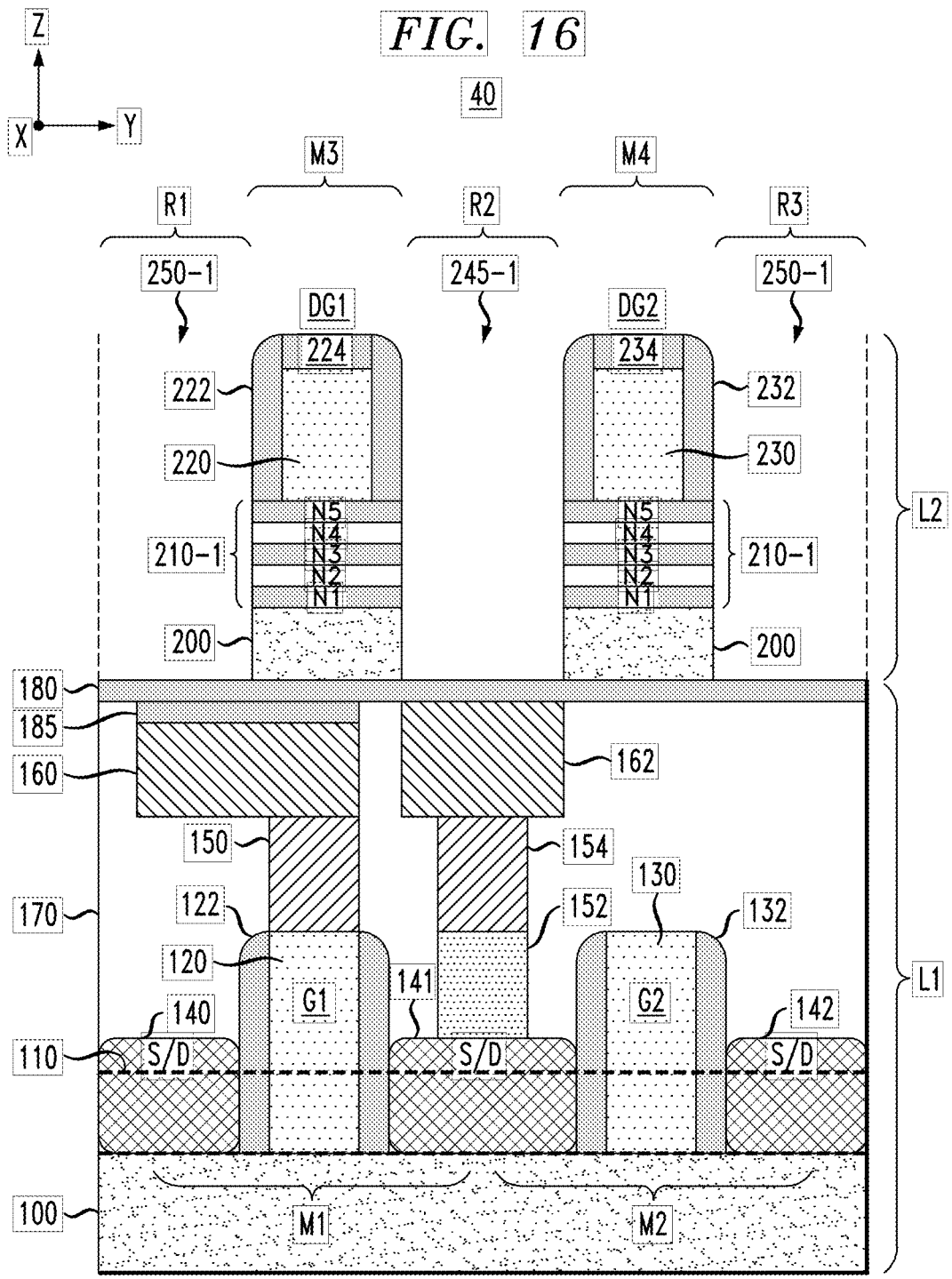

Next, FIG. 16 is a schematic cross-sectional side view of the semiconductor device structure of FIG. 15 after concurrently forming an interlayer via contact opening 245-1, and source/drain contact openings 250-1. In this embodiment, an etch process is performed on the intermediate semiconductor device structure of FIG. 15 to etch exposed portions of the insulating layer 240, and the underlying nanosheet stack structures 210 and substrate 200 in the source/drain regions R1, R2, and R3, stopping on the etch stop layer 180, to concurrently pattern and form the source/drain contact openings 250-1 and the interlayer via contact opening 245-1, as shown in FIG. 16.

Figure 17:
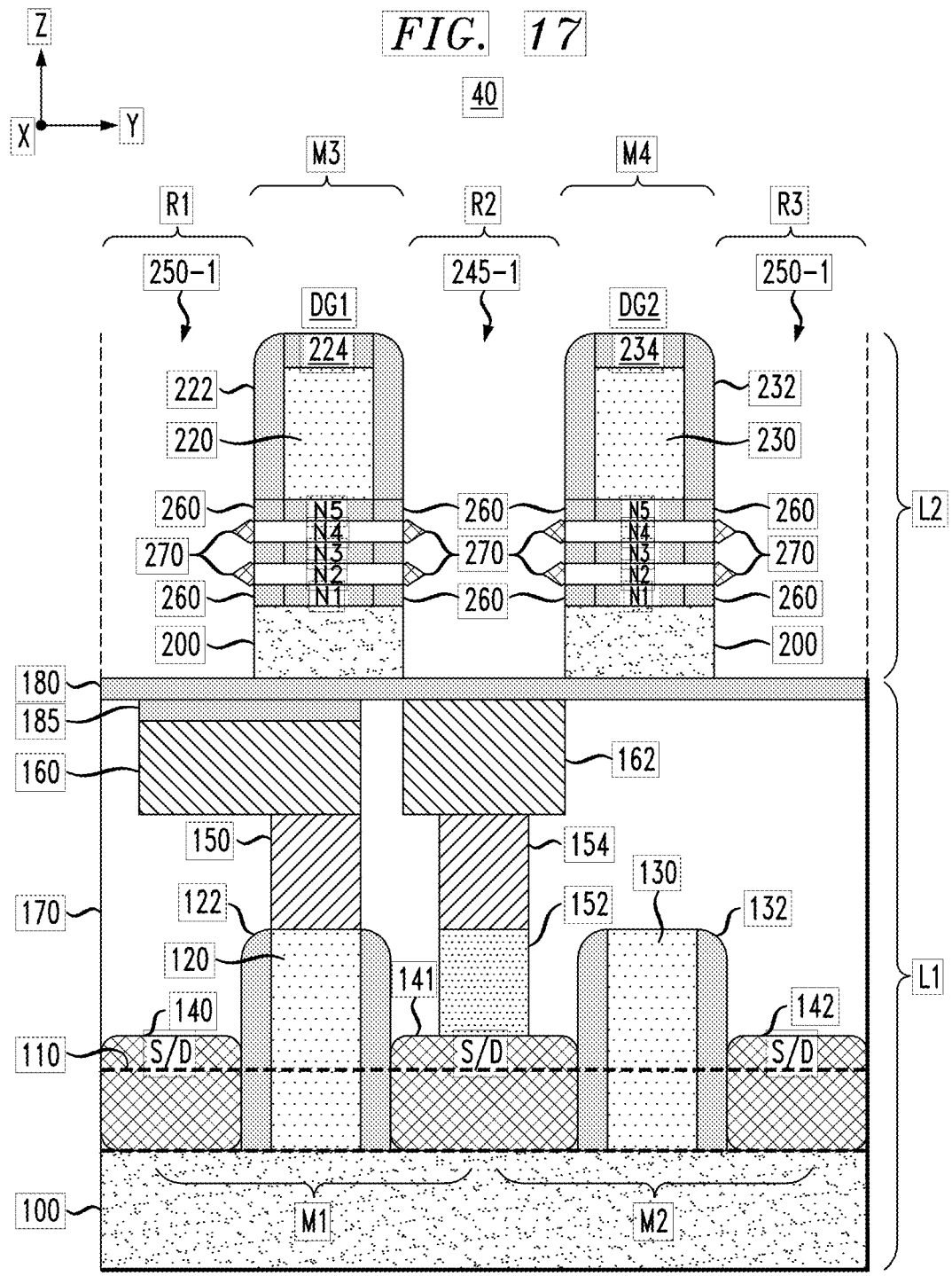

Next, FIG. 17 is a schematic cross-sectional side view of the semiconductor device structure of FIG. 16 after the forming inner spacers 260 and source/drain layers 270 on the sidewalls of the nanosheet stack structures 210-1 of the nanosheet FET devices M3 and M4. In one embodiment, the semiconductor device structure of FIG. 17 is fabricated using the same or similar process flow as schematically illustrated and discussed above in conjunction with FIG. 4, the details of which will not be repeated. In the example embodiment of FIG. 17, the etch stop layer 180 serves as an etch stop layer when etching the interlayer via contact opening 245-1 and the source/drain contact openings 250-1, and also serves to protect the metallic interconnect structures 160 and 162 during epitaxial growth of the source/drain layers 270 within the interlayer via contact opening 245-1 and source/drain contact openings 250-1.

Figure 18:
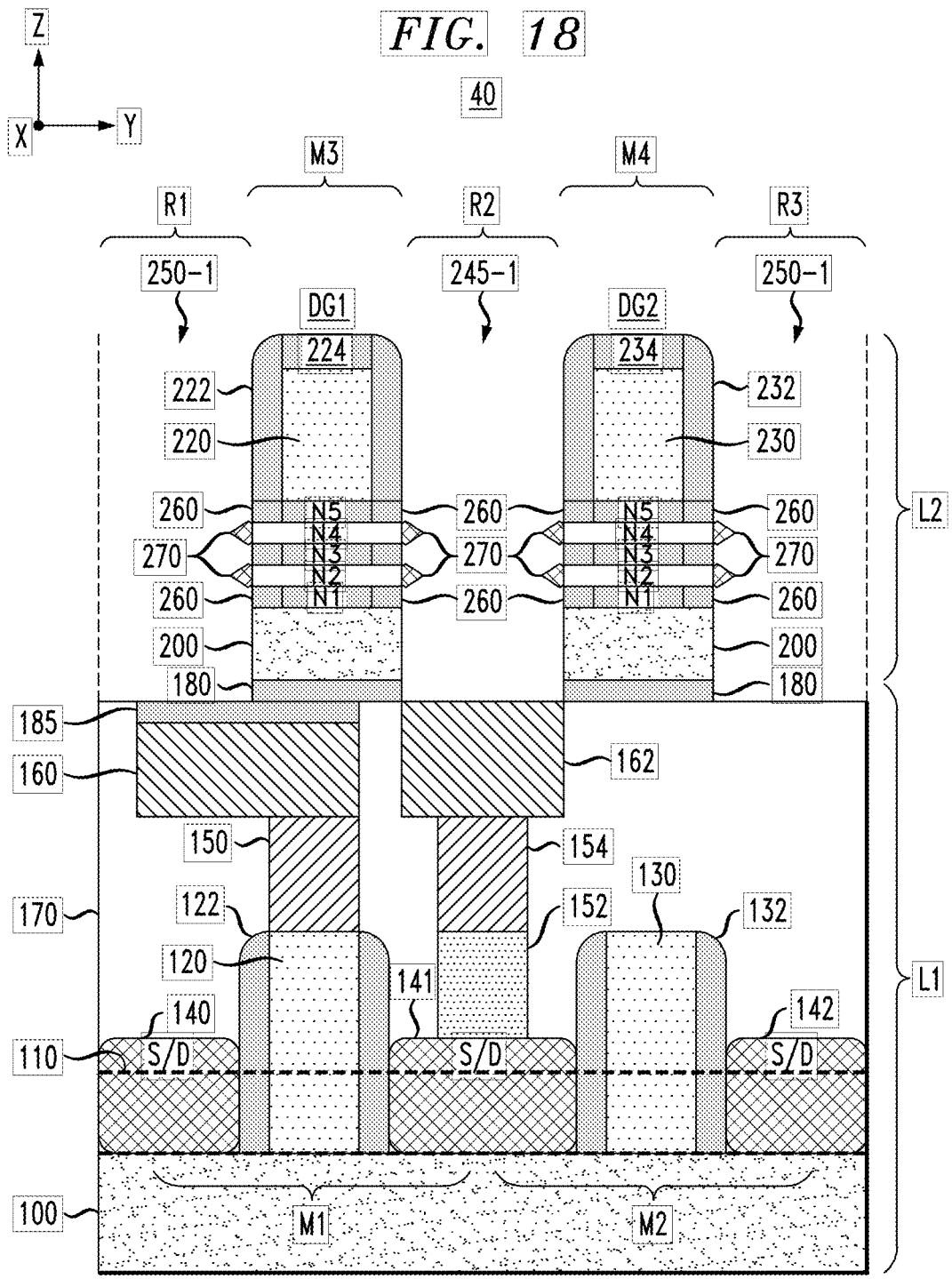

Next, FIG. 18 is a schematic cross-sectional side view of the semiconductor device structure of FIG. 17 after removing portions of the etch stop layer 180 exposed at the bottom of the interlayer via contact opening 245-1 and the source/drain contact openings 250-1. In one embodiment, the exposed portions of the etch stop layer 180 are removed using a wet or dry etch methods which are the same or similar to the etch methods discussed above in conjunction with FIG. 5 for removing the exposed portion of the buried etch stop layer 180, the details of which will not be repeated. In the example embodiment of FIG. 18, the etch process is performed to expose the underlying metallic interconnect structure 162, while the metallic interconnect structure 160 in the non-interlayer via location remains covered the etch stop layer 185 formed on the recessed surface thereof.

It is to be noted that the etch process of FIG. 18 eliminates the need, for example, to form a blocking photoresist layer 300 (as shown in FIG. 13) to fill the source/drain contact openings 250-1 with sacrificial material prior to etching the etch stop layer to expose the metallic interconnect structure 162 at the bottom of the interlayer via contact opening 245-1. Indeed, in the exemplary embodiment of FIG. 18, a blanket recess process is performed to etch down the exposed portions of the etch stop layer 180 at the bottoms of the contact openings 245-1 and 250-1, while the metallic interconnect structures in the non-IL via locations remain protected by the embedded etch stop layers 185.

Next, following the formation of the semiconductor device structure shown in FIG. 18, the processing continues to form thin silicide layers on the surfaces of the epitaxial source/drain layers 270, forming an interlayer via contact in the interlayer via contact opening 245-1, and forming source/drain contacts in the source/drain contact openings 250-1. In one embodiment, the silicide layers, the interlayer via contact, and the source/drain contacts are formed using the same or similar materials and fabrication techniques for constructing the intermediate device structure shown in FIG. 6 as discussed above, the details of which will not be repeated. In this exemplary embodiment, the source/drain contacts formed in the source/drain contact openings 250-1 in the source/drain regions R1 and R3 are isolated from the metallic interconnect structure 160 by the etch stop layer 185 and from the insulating layer 170 by the liner layers (e.g., diffusion barrier layers) that are formed to line the bottom and sidewall surfaces of the contact openings 250-1 prior to the metal fill process to form the source/drain contacts. Following the formation of the interlayer via contact in the interlayer via contact opening 245-1, and the source/drain contacts in the source/drain contact openings 250-1, a replacement metal gate process is performed to replace the dummy gate layers 220 and 230 of the gate structures DG1 and DG2 with metal gates using known techniques and materials.

It is to be understood that the methods discussed herein for fabricating interlayer via contacts within source/drain regions of FET devices of a monolithic 3D semiconductor IC device, can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A method for fabricating a semiconductor device, comprising:
    forming a semiconductor integrated circuit device comprising a first device layer and a second device layer disposed on the first device layer, wherein the first device layer comprises a metallic interconnect structure formed in an insulating layer, and an etch stop layer formed over the metallic interconnect structure, and wherein the second device layer comprises a first field-effect transistor device comprising a first gate structure, and a second field-effect transistor device comprising a second gate structure;
    forming an interlayer via contact opening between the first and second gate structures, wherein a width of the interlayer via contact opening is defined by a spacing between adjacent sidewalls of the first and second gate structures;
    forming epitaxial source/drain layers within the interlayer via contact opening for the first and second field-effect transistor devices; and
    forming a metallic interlayer via contact within the interlayer via contact opening in contact with an exposed portion of the metallic interconnect structure of the first device layer.

2. The method of claim 1, wherein forming the interlayer via contact opening between the first and second gate structures comprises:
    etching the interlayer via contact opening in an insulating layer of the second device layer down to a level which exposes a portion of the etch stop layer formed over the metallic interconnect structure of the first device layer; and
    etching the exposed portion of the etch stop layer at a bottom of the interlayer via contact opening to expose a portion of the metallic interconnect structure of the first device layer, wherein etching the exposed portion of the etch stop layer is performed subsequent to forming the epitaxial source/drain layers within the interlayer via contact opening for the first and second field-effect transistor devices.

3. The method of claim 1, wherein the etch stop layer is formed on a surface of the insulating layer of the first device layer.

4. The method of claim 1, wherein the etch stop layer is formed on a recessed surface of the metallic interconnect structure.

5. The method of claim 1, further comprising:
forming source/drain contact openings within source/drain regions adjacent to the first and second gate structures in non-interlayer via contact locations;
forming epitaxial source/drain layers within the source/drain contact openings for the first and second field-effect transistor devices concurrently with forming the epitaxial source/drain layers within the interlayer via contact opening; and
forming metallic source/drain contacts within the source/drain contact openings concurrently with forming the metallic interlayer via contact within the interlayer via contact opening.

6. The method of claim 5, wherein the first and second gate structures comprise dummy gate layers, and the method further comprising performing a replacement metal gate process to replace the dummy gate layers with metallic gate structures, subsequent to forming the metallic interlayer via contact and the metallic source/drain contacts.

7. The method of claim 1, further comprising:
prior to forming the epitaxial source/drain layers within the interlayer via contact opening, performing an etch process to form source/drain contact openings within source/drain regions adjacent to the first and second gate structures in non-interlayer via contact locations;
wherein performing the etch process to form the source/drain contact openings comprises:
forming an etch mask which fills the interlayer via contact opening with sacrificial mask material and which comprises openings to expose the source/drain regions adjacent to the first and second gate structures in the non-interlayer via contact locations;
etching source/drain contact openings in the source/drain regions exposed through the etch mask; and
removing the etch mask to remove the sacrificial mask material from the interlayer via contact opening.

8. The method of claim 7, further comprising forming epitaxial source/drain layers within the source/drain contact openings for the first and second field-effect transistor devices concurrently with forming the epitaxial source/drain layers within the interlayer via contact opening.

9. The method of claim 1, further comprising:
performing an etch process to form source/drain contact openings within source/drain regions adjacent to the first and second gate structures in non-interlayer via contact locations concurrently with forming the interlayer via contact opening between the first and second gate structures;
wherein performing the etch process comprises etching the source/drain contact openings and interlayer via contact opening through the second device layer down the etch stop layer of the first device layer.

10. The method of claim 1, wherein forming the interlayer via contact opening between the first and second gate structures comprises completely etching away one of (i) a portion of a vertical semiconductor fin disposed between the first and second gate structures and (ii) a portion of a nanosheet stack structure disposed between the first and second gate structures.

11. A method for fabricating a semiconductor device, comprising:
forming a semiconductor integrated circuit device comprising a first device layer and a second device layer disposed on the first device layer;
wherein the first device layer comprises a first metallic interconnect structure and a second metallic interconnect structure formed in an insulating layer, a first etch stop layer formed on a recessed surface of the first metallic interconnect structure which is recessed below an upper surface of the insulating layer, and a second etch stop layer formed on the upper surface of the insulating layer and on an upper surface of the second metallic interconnect structure;
wherein the second device layer comprises a first field-effect transistor device comprising a first gate structure, and a second field-effect transistor device comprising a second gate structure, wherein the second metallic interconnect structure is aligned to a source/drain region between the first and second gate structures;
performing an etch process to form an interlayer via contact opening between the first and second gate structures and source/drain contact openings within source/drain regions adjacent to the first and second gate structures in non-interlayer via contact locations, wherein the interlayer via contact opening and the source/drain contact openings are etched to a depth to expose portions of the second etch stop layer formed on the upper surface of the insulating layer of the first device layer, and wherein a width of the interlayer via contact opening is defined by a spacing between adjacent sidewalls of the first and second gate structures;
forming epitaxial source/drain layers for the first and second field-effect transistor devices within the interlayer via contact opening and the source/drain contact openings;
etching the exposed portions of the second etch stop layer at a bottom of the interlayer via contact opening and the source/drain contact openings, to expose the upper surface of the second metallic interconnect structure; and
depositing one or more layers of metallic material to form a metallic interlayer via contact within the interlayer via contact opening in contact with the exposed upper surface of the second metallic interconnect structure of the first device layer, and metallic source/drain contacts within the source/drain contact openings.

12. The method of claim 11, wherein the first etch stop layer formed on the recessed surface of the first metallic interconnect structure serves as a capping layer to protect the first metallic interconnect structure during etching of the second etch stop layer.

13. The method of claim 11, wherein the first and second gate structures comprise dummy gate layers, and further comprising performing a replacement metal gate process to replace the dummy gate layers with metallic gate structures, subsequent to forming the metallic interlayer via contact and the metallic source/drain contacts.

14. The method of claim 11, wherein forming the interlayer via contact opening between the first and second gate structures comprises completely etching away a portion of a vertical semiconductor fin disposed between the first and second gate structures.

15. The method of claim 11, wherein forming the interlayer via contact opening between the first and second gate structures comprises completely etching away a portion of a nanosheet stack structure disposed between the first and second gate structures.

* * * * *